(12) United States Patent
Kinoshita et al.

(10) Patent No.: US 11,469,127 B2
(45) Date of Patent: Oct. 11, 2022

(54) SUBSTRATE PROCESSING DEVICE

(71) Applicant: Kioxia Corporation, Minato-ku (JP)

(72) Inventors: Shigeru Kinoshita, Yokohama (JP);
Shusaku Matsumoto, Saitama (JP);
Koichiro Kawano, Yokohama (JP);
Hiroshi Fujita, Yokohama (JP);
Yoshinori Kitamura, Tsu (JP)

(73) Assignee: Kioxia Corporation, Minato-ku (JP)

( * ) Notice: Subject to any disclaimer, the term of this patent is extended or adjusted under 35 U.S.C. 154(b) by 41 days.

(21) Appl. No.: 16/931,723

(22) Filed: Jul. 17, 2020

(65) Prior Publication Data
US 2021/0082728 A1 Mar. 18, 2021

Related U.S. Application Data

(63) Continuation of application No. PCT/JP2019/035965, filed on Sep. 12, 2019.

(51) Int. Cl.
*H01L 21/677* (2006.01)
*H01L 21/673* (2006.01)
(Continued)

(52) U.S. Cl.
CPC .......... *H01L 21/67757* (2013.01); *B08B 3/08* (2013.01); *B08B 3/102* (2013.01);
(Continued)

(58) Field of Classification Search
None
See application file for complete search history.

(56) References Cited

U.S. PATENT DOCUMENTS 6,675,817 B1 * 1/2004 Doh ..................... C03C 15/00
134/56 R
7,160,416 B2 1/2007 Hasegawa et al.
(Continued)

FOREIGN PATENT DOCUMENTS

JP 07-022371 A 1/1995
JP 07-058078 A 3/1995
(Continued)

OTHER PUBLICATIONS

International Search Report dated Nov. 26, 2019 in PCT/JP2019/035965 filed on Sep. 12, 2019 (with English Translation of Categories of Cited Documents), 4 pages.
(Continued)

*Primary Examiner* — Sylvia Macarthur
(74) *Attorney, Agent, or Firm* — Oblon, McClelland, Maier & Neustadt, L.L.P.

(57) ABSTRACT

A substrate processing device according to the present embodiment includes a processing tank configured to be capable of accumulating a liquid. A conveyer can array a plurality of semiconductor substrates in such a manner that front surfaces of the semiconductor substrates face a substantially horizontal direction, and transport the semiconductor substrates into the processing tank. A plurality of liquid suppliers can supply the liquid toward an inside of the processing tank from a lower portion of the processing tank. A plurality of current plates are arranged on at least either one end side or the other end side of an array of the semiconductor substrates. The current plates are provided in a first gap region above the semiconductor substrates in gaps between the conveyer and a sidewall of the processing tank on both sides of the conveyer as viewed from an array direction of the semiconductor substrates.

20 Claims, 17 Drawing Sheets

(51) Int. Cl.
*H01L 21/67* (2006.01)
*B08B 3/10* (2006.01)
*B08B 3/08* (2006.01)
*B08B 13/00* (2006.01)

(52) U.S. Cl.
CPC ........ B08B 13/00 (2013.01); H01L 21/67057 (2013.01); H01L 21/67086 (2013.01); H01L 21/67326 (2013.01)

(56) References Cited

U.S. PATENT DOCUMENTS

| | | | | |
|---|---|---|---|---|
| 8,043,468 | B2* | 10/2011 | Osawa | H01L 21/67086 156/345.18 |
| 8,216,417 | B2* | 7/2012 | Fujiwara | H01L 21/67057 156/345.15 |
| 9,027,573 | B2 | 5/2015 | Hyakutake et al. | |
| 10,160,012 | B2* | 12/2018 | Sugiyama | B08B 3/04 |
| 10,615,059 | B2 | 4/2020 | Shomori et al. | |
| 2004/0163682 | A1* | 8/2004 | Boyd | H01L 21/67057 134/33 |
| 2016/0035587 | A1* | 2/2016 | Keech | H01L 21/4803 216/90 |
| 2017/0309501 | A1* | 10/2017 | Kitamura | H01L 21/67086 |
| 2021/0082728 | A1* | 3/2021 | Kinoshita | B08B 11/02 |

FOREIGN PATENT DOCUMENTS

| | | |
|---|---|---|
| JP | 07-161677 A | 6/1995 |
| JP | 2006-032673 A | 2/2006 |
| JP | 2009-238802 A | 10/2009 |
| JP | 2017-195338 A | 10/2017 |
| TW | 200603273 | 1/2006 |
| TW | 201212113 A1 | 3/2012 |
| TW | 201717274 A | 5/2017 |

OTHER PUBLICATIONS

U.S. Appl. No. 16/561,375, filed Sep. 5, 2019, Kinoshita et al. (Corresponding to Japanese patent application 2019-538452).

* cited by examiner

SUBSTRATE PROCESSING DEVICE

CROSS REFERENCE TO RELATED APPLICATIONS

This application is based upon and claims the benefit of priority from the prior International Patent Application No. JP2019/035965, filed on Sep. 12, 2019, the entire contents of which are incorporated herein by reference.

FIELD

The embodiments of the present invention relate to a substrate processing device.

BACKGROUND

A batch substrate processing device houses semiconductor substrates in a processing tank and processes the semiconductor substrates with a chemical. Such a substrate processing device circulates the chemical to keep a uniform concentration or the like of the chemical in the processing tank. In order to circulate the chemical, the substrate processing device supplies the chemical from nozzles in the processing tank, recovers the chemical flowing over the upper end portion of the processing tank, performs processing such as removal of impurities, and then supplies again the chemical from the nozzles to the processing tank.

While the chemical is circulated in this way, the flow velocity of the chemical varies according to locations in the processing tank. Variation in the flow velocity of the chemical leads to variation in the processing speed such as the etching rate on the surfaces of the semiconductor substrates. There is also a risk that by-products such as silica deposit on the surfaces of the semiconductor substrates in regions where the flow velocity of the chemical is low.

DETAILED DESCRIPTION

Embodiments of the present invention will be described below in detail with reference to the accompanying drawings. These embodiments do not limit the present invention. The drawings are schematic or conceptual and the ratio of respective parts and the like are not necessarily the same as those of real products. In the specification and the drawings, constituent elements identical to those described with respect to the drawings that have been already described are denoted by like reference signs, and detailed explanations thereof are appropriately omitted.

A substrate processing device according to the present embodiment includes a processing tank configured to be capable of accumulating a liquid. A conveyer can array a plurality of semiconductor substrates in such a manner that front surfaces of the semiconductor substrates face a substantially horizontal direction, and transport the semiconductor substrates into the processing tank. A plurality of liquid suppliers can supply the liquid toward an inside of the processing tank from a lower portion of the processing tank. A plurality of current plates are arranged on at least either one end side or the other end side of an array of the semiconductor substrates. The current plates are provided in a first gap region above the semiconductor substrates in gaps between the conveyer and a sidewall of the processing tank on both sides of the conveyer as viewed from an array direction of the semiconductor substrates.

First Embodiment

Figure 1:
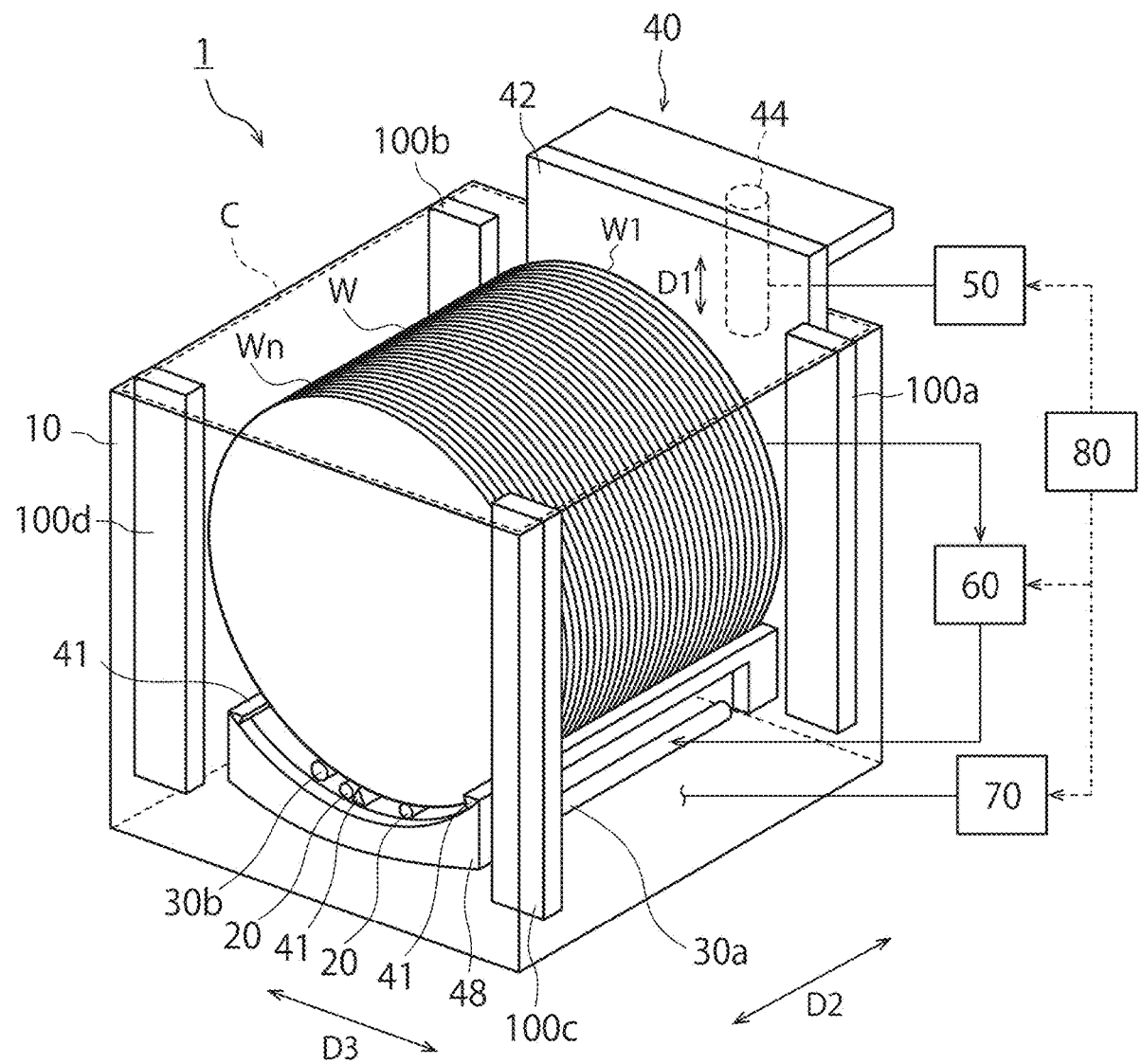
FIG. 1 is a perspective view illustrating a configuration example of a substrate processing device according to a first embodiment.
Figure 2:
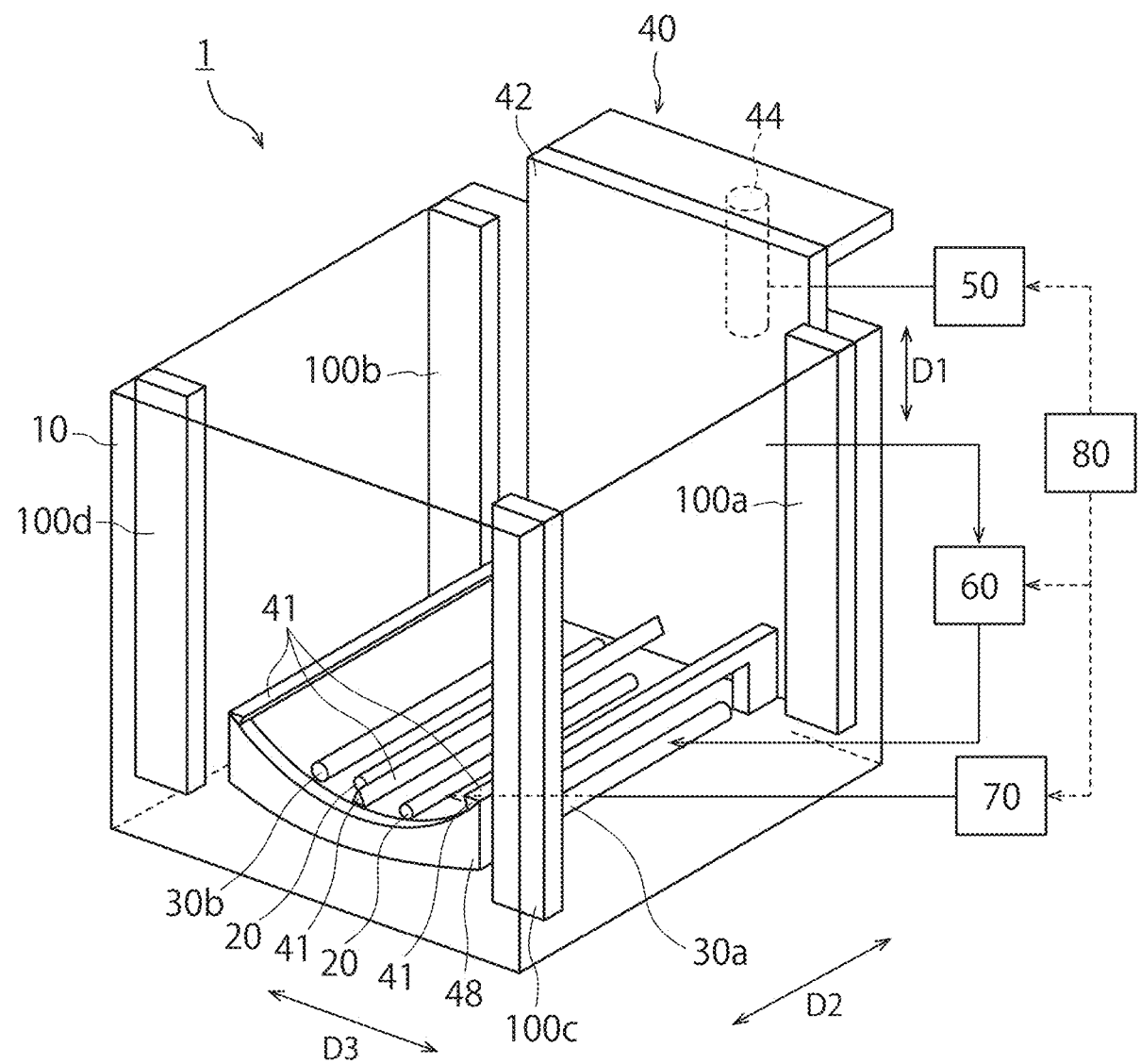
FIG. 2 is a perspective view illustrating a configuration example of the substrate processing device according to the first embodiment.

FIGS. 1 and 2 are perspective views illustrating a configuration example of a substrate processing device 1 according to a first embodiment. The substrate processing device (hereinafter, simply "processing device") 1 is a device, such as a batch cleaning device or wet etching device, that immerses a plurality of semiconductor substrates W in a chemical C to process the semiconductor substrates W. For example, the chemical C is a hot phosphoric acid solution and can be used to etch a silicon nitride film having a structure formed on the semiconductor substrates W.

The processing device 1 includes a processing tank 10, a gas supply pipe 20, chemical supply pipes 30*a* and 30*b*, a lifter 40, a driver 50, a circulation tank 60, a gas supply cylinder 70, a controller 80, and current plates 100*a* to 100*d*.

The processing tank 10 is capable of accumulating the chemical C and can house therein the semiconductor substrates W in a state of setting up the semiconductor substrates W in a substantially vertical direction. The semiconductor substrates W are mounted on the lifter 40 so as to be rested in a substantially vertical direction and are housed in the processing tank 10 with the lifter 40. The semiconductor substrates W are immersed in the chemical C by being housed in the processing tank 10.

The gas supply pipe 20 being a gas supplier is provided near a bottom portion of the processing tank 10 and is positioned below the semiconductor substrates W housed in the processing tank 10. The gas supply pipe 20 supplies gas bubbles to the chemical C from below the semiconductor substrates W. It is preferable that the gas supply pipe 20 is provided to agitate the chemical C. However, the gas supply pipe 20 does not always need to be provided.

Figure 18A:
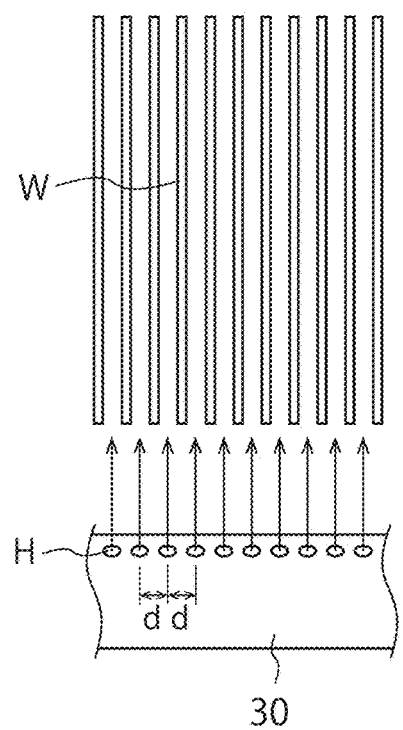
FIGS. 18A and 18B are diagrams illustrating an arrangement relation between chemical supply pipes and semiconductor substrates.
Figure 18B:
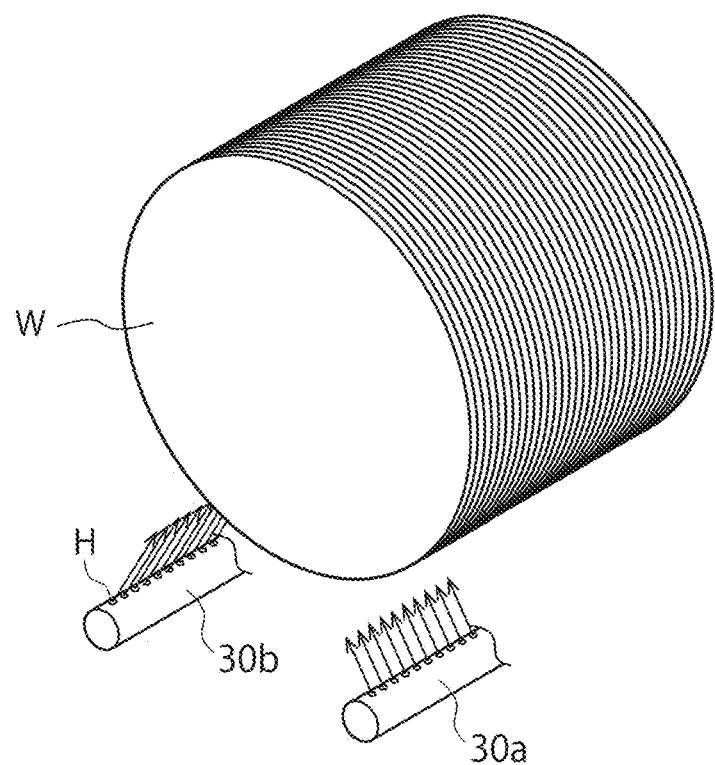

The chemical supply pipes 30*a* and 30*b* being a chemical supplier are provided near a bottom portion of the processing tank 10 and are provided below the semiconductor substrates W housed in the processing tank 10. The chemical supply pipes 30*a* and 30*b* eject the chemical C from a lower portion of the processing tank 10 toward the inside of the processing tank 10. The chemical supply pipes 30*a* and 30*b* can supply the chemical C in such a manner that supply directions of the chemical C toward the inside intersect with each other. FIGS. 18A and 18B are diagrams illustrating an arrangement relation between the chemical supply pipes 30*a* and 30*b* and the semiconductor substrates W. The chemical supply pipes 30*a* and 30*b* have nozzle holes H arrayed at intervals substantially equal to intervals between the semiconductor substrates W to enable the chemical C to be supplied to between adjacent ones of the semiconductor substrates W. Nozzle holes H for supplying the chemical C to between the semiconductor substrates W and a conveyer plate 42 of the lifter 40, which will be explained later, and nozzle holes H for supplying the chemical C to between the semiconductor substrates W and an inner wall of the processing tank 10 are also arranged at the substantially equal intervals. The directions of the nozzle holes H can all be the same direction although not particularly limited thereto. However, it is preferable that the nozzle holes H for supplying the chemical C to between adjacent ones of the semiconductor substrates W face the same direction.

The lifter 40 being a conveyer includes supports 41, the conveyer plate 42, a supporting post 44, and a connection plate 48 and is configured to be capable of transporting the semiconductor substrates W into the processing tank 10. The supports 41 array the semiconductor substrates to be rested in a substantially vertical direction (in such a manner that the surfaces of the semiconductor substrates W face a substantially horizontal direction) and support side portions (lower end potions) of the semiconductor substrates W from below. The conveyer plate 42 connects with the supports 41 and faces the front or rear surface of a semiconductor substrate W1 arrayed near the conveyer plate 42 among the semiconductor substrates W. The distance between the conveyer plate 42 and the semiconductor substrate W1 is, for example, 20 millimeters to 40 millimeters. The conveyer plate 42 of the lifter 40 is connected to the supporting post 44 and can be moved by the driver 50 in substantially vertical directions D1. The connection plate 48 is provided on the opposite side to the conveyer plate 42, connects the supports 41, and sandwiches the supports 41 with the conveyer plate 42 to fix the supports 41. Side portions of the lifter 40 open the side portions of the semiconductor substrates W in directions D3 orthogonal to array directions D2 of the semiconductor substrates W in a substantially horizontal plane. Therefore, the lifter 40 has a different configuration from that of a general carrier box to be used for transport of semiconductor substrates.

The current plates 100*a* and 100*b* being first and second current plates are arranged on a side toward the conveyer plate 42 of the array of the semiconductor substrates W, and the current plates 100*c* and 100*d* being third and fourth current plates are arranged on a side toward the connection plate 48 of the array of the semiconductor substrates W. The current plates 100*a* to 100*d* are fixed on inner walls of the processing tank 10 and are arranged not to be in contact (interfere) with the lifter 40 and the semiconductor substrates W when the lifter 40 is moved up and down in the directions D1. The current plates 100*a* to 100*d* have, for example, a plate-like shape or a quadrangular prism shape and are formed of a corrosive-resistant material such as fluororesin or quartz. Detailed configurations and arrangements of the current plates 100*a* to 100*d* will be explained later.

The circulation tank 60 accumulates the chemical C having flowed over the processing tank 10. In processing the semiconductor substrates W, the processing tank 10 is filled with the chemical C and the chemical C having flowed over the processing tank 10 is recovered by the circulation tank 60. The chemical C in the circulation tank 60 is passed through a pipe, a pump, and a filter (all not illustrated) and is returned to the processing tank 10 from the chemical supply pipes 30*a* and 30*b*. Accordingly, the chemical C is circulated between the processing tank 10 and the circulation tank 60 while filtered by the filter.

The gas supply cylinder 70 supplies gas to the gas supply pipe 20 to supply gas bubbles from the gas supply pipe 20. The gas bubbles are supplied to agitate the chemical C and uniformize the phosphoric acid concentration or the silica concentration in the chemical C. The controller 80 controls the driver 50, the circulation tank 60, and the gas supply cylinder 70.

Figure 3:
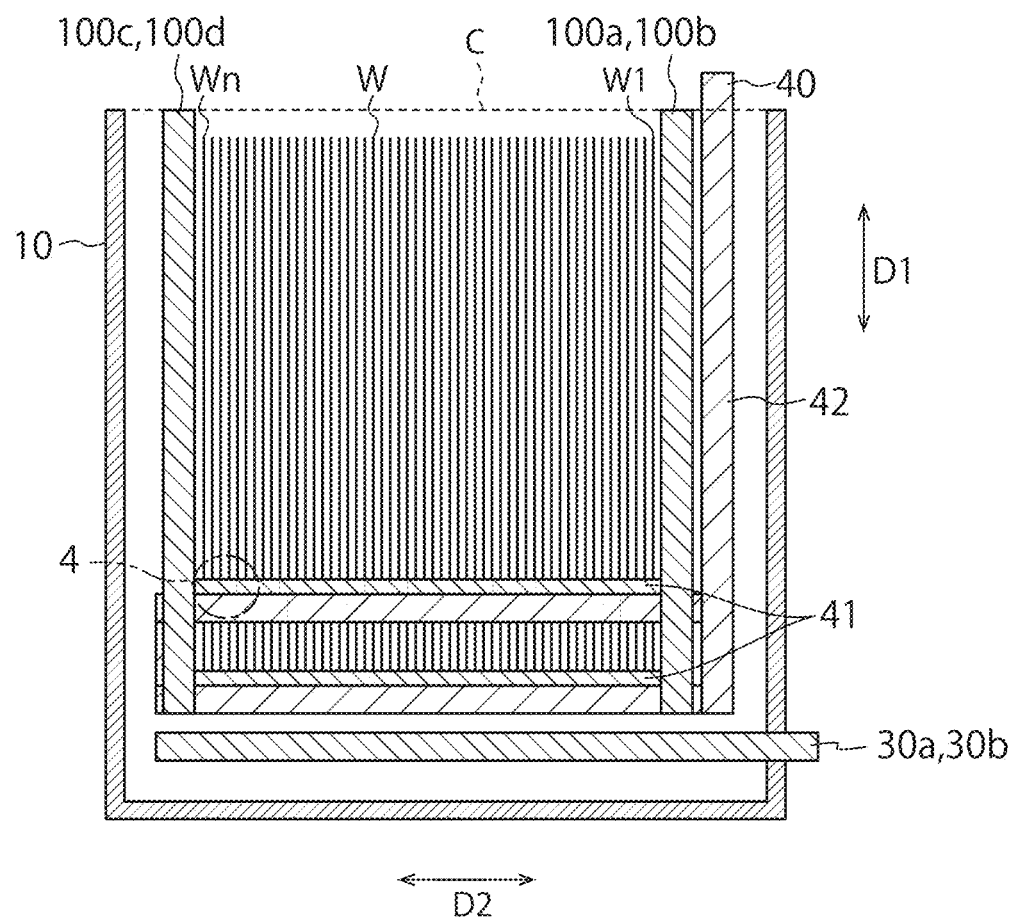
FIG. 3 is a side view of a lifter in an inner portion of a processing tank.
Figure 4:
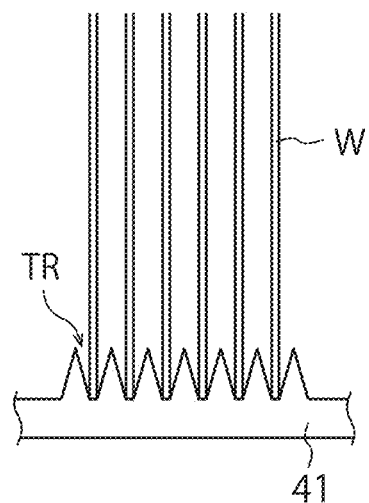
FIG. 4 is an enlarged view of a portion in a dashed circle 4 in FIG. 3.

FIG. 3 is a side view of an inner portion of the processing tank. FIG. 4 is an enlarged view of a portion in a dashed circle 4 in FIG. 3. The lifter 40 rests the semiconductor substrates W in the substantially vertical directions D1 and arrays the semiconductor substrates W in such a manner that the surfaces thereof face the substantially horizontal direction. As illustrated in FIG. 4, the supports 41 have trenches TR to support the semiconductor substrates W from below and set the intervals between the semiconductor substrates W to a predetermined value. The semiconductor substrates W are received by the trenches TR and are arrayed at substantially equal intervals, respectively. The conveyer plate 42 is connected to the supports 41 and extends in the directions D1 from the supports 41. The chemical supply pipes 30*a* and 30*b* and the gas supply pipe 20 are arranged below the lifter 40. Each pair of adjacent ones of the semiconductor substrates W is arrayed in such a manner that the front surfaces (element formation surfaces) thereof face each other. Pairs of semiconductor substrates W where the front surfaces face each other are arrayed along the array directions D2 of the semiconductor substrates W in a state in which the rear surfaces of semiconductor substrates W face each other in adjacent pairs. However, the orientation of the semiconductor substrates W is not limited thereto.

The current plates 100*a* and 100*b* are arranged on one end side of the array of the semiconductor substrates W and are positioned between the conveyer plate 42 and the semiconductor substrates W as viewed from a lateral direction of the lifter 40 (the direction D3 in FIG. 1). The current plates 100*a* and 100*b* are away from the conveyer plate 42 and the semiconductor substrates W so as not to be in contact therewith. It is preferable that the distance between the current plates 100*a* and 100*b* and a semiconductor substrate W1 adjacent thereto along the directions D2 is substantially the same (for example, 5 millimeters to 10 millimeters) as the interval between adjacent ones of the semiconductor substrates W. However, the distance between the current plates 100a and 100b and the semiconductor substrate W1 may be slightly larger than the interval between adjacent ones of the semiconductor substrates W. For example, the distance between the current plates 100a and 100b and the semiconductor substrate W1 adjacent thereto in the directions D2 preferably has a value from the interval between the semiconductor substrates W to twice as large as the interval so as to prevent the current plates 100a and 100b from being in contact with the conveyer plate 42 and the semiconductor substrates W.

The current plates 100c and 100d are arranged on the other end side of the array of the semiconductor substrates W and are positioned between the connection plate 48 and the semiconductor substrates W as viewed from a lateral direction of the lifter 40 (the direction D3 in FIG. 1). The current plates 100c and 100d are away from the connection plate 48 and the semiconductor substrates W so as not to be in contact therewith. It is preferable that the distance between the current plates 100c and 100d and a semiconductor substrate Wn (n is an integer equal to or larger than 2) adjacent thereto along the directions D2 is substantially the same (for example, 5 millimeters to 10 millimeters) as the interval between adjacent ones of the semiconductor substrates W. However, the distance between the current plates 100c and 100d and the semiconductor substrate Wn may be slightly larger than the interval between adjacent ones of the semiconductor substrates W. For example, the distance between the current plates 100c and 100d and the semiconductor substrate Wn adjacent thereto along the directions D2 preferably has a value from the interval between the semiconductor substrates W to twice as large as the interval to prevent the current plates 100c and 100d from being in contact with the connection plate 48 and the semiconductor substrates W.

Figure 5:
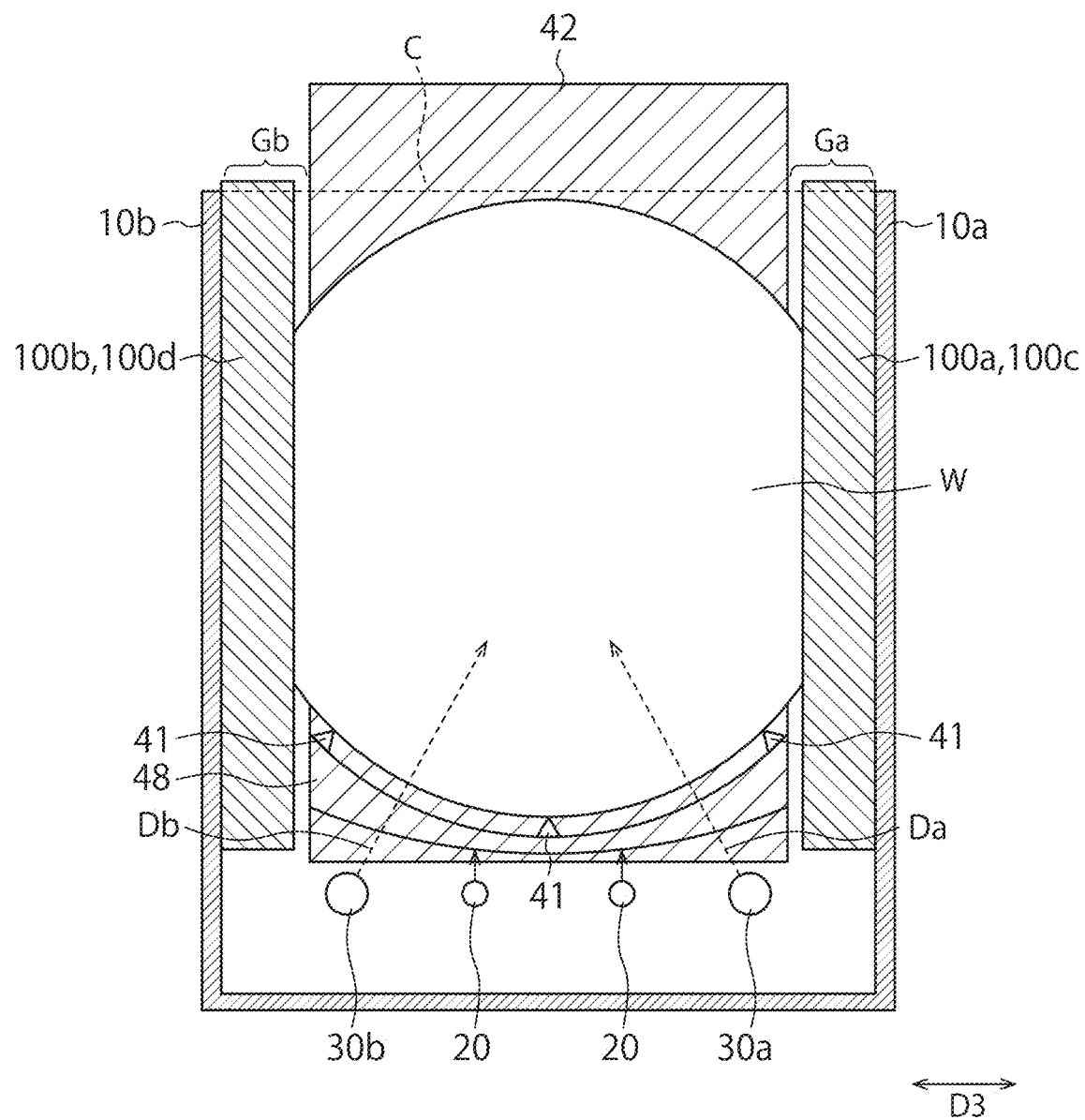
FIG. 5 is a front view of the processing tank and the lifter.

FIG. 5 is a front view of the processing tank and the lifter. As viewed from the array direction of the semiconductor substrates W (the direction D2 in FIG. 1), the current plates 100a to 100d are provided on both sides of the lifter 40 in the directions D3.

The current plates 100a and 100c are fixed to a sidewall 10a of the processing tank 10 and are provided in a gap Ga between the lifter 40 and the sidewall 10a. The current plates 100a and 100c are arranged in the gap Ga and are arranged between the semiconductor substrates W and the conveyer plate 42 or the connection plate 48 as illustrated FIG. 3. Therefore, the current plates 100a and 100c are not in contact (do not interfere) with the body of the lifter 40 and the semiconductor substrates W when the lifter 40 moves up and down.

The current plates 100b and 100d are fixed to a sidewall 10b of the processing tank 10 and are provided in a gap Gb between the lifter 40 and the sidewall 10b. The current plates 100b and 100d are arranged in the gap Gb and are arranged between the semiconductor substrates W and the conveyer plate 42 or the connection plate 48 as illustrated FIG. 3. Therefore, the current plates 100b and 100d are not in contact (do not interfere) with the body of the lifter 40 and the semiconductor substrates W when the lifter 40 moves up and down.

The chemical C is ejected obliquely upward toward substantial centers of the semiconductor substrates W from the nozzles holes of the chemical supply pipes 30a and 30b located obliquely below the center of the lifter 40 or the semiconductor substrates W. At this time, the chemical C flows in directions Da and Db between adjacent ones of the semiconductor substrates W or between the conveyer plate 42 and the semiconductor substrates W. The chemical C ejected from the chemical supply pipe 30a and the chemical C ejected from the chemical supply pipe 30b collide each other, join together, and attempt to flow upward at each intersecting position X of the ejecting directions from the both supply pipes.

Figure 6:
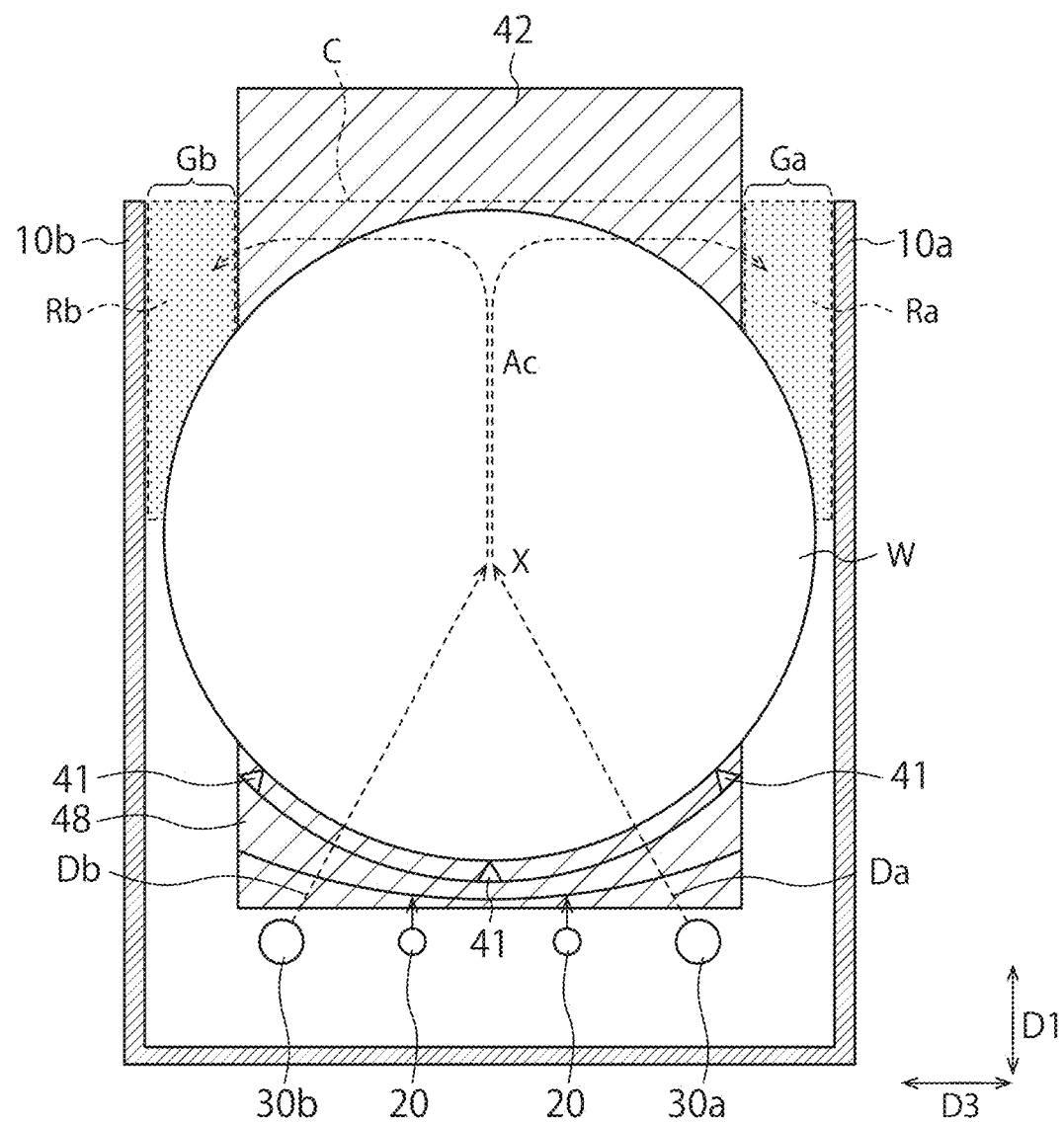
FIG. 6 is a sectional view illustrating a configuration of a substrate processing device not including current plates.

Flows of the chemical C are explained below. FIG. 6 is a sectional view illustrating a configuration of a substrate processing device not including the current plates 100a to 100d. In a case in which the current plates 100a to 100d are not provided, the chemical C in the vicinity of the conveyer plate 42 flows upward from the intersecting position X and flows to the vicinity of upper ends of the semiconductor substrates W (near the liquid surface of the chemical C that is above the semiconductor substrates W), as indicated by dashed arrows Ac. The chemical C having moved upward to the vicinity of the upper ends of the semiconductor substrates W in the vicinity of the conveyer plate 42 further flows into regions Ra and Rb on the both sides in the directions D3. The regions Ra and Rb being a first gap region are regions located above the substantial centers of the semiconductor substrates W in the gaps Ga and Gb, respectively. As viewed from the directions D2, the conveyer plate 42 is not provided in the regions Ra and Rb and the semiconductor substrates W are not provided on one side of the conveyer plate 42. Therefore, the chemical C is likely to flow over the processing tank 10 to be circulated or flow in a direction perpendicular to the plane of the drawing of FIG. 6 (a direction toward the conveyer plate 42 out of the directions D2 in FIG. 2) in the regions Ra and Rb.

The same characteristic as in the vicinity of the conveyer plate 42 also holds true for the vicinity of the connection plate 48. For example, the chemical C in the vicinity of the connection plate 48 flows upward from the intersecting position X and flows into the regions Ra and Rb as indicated by the dashed arrows Ac. As viewed from the directions D2, the connection plate 48 is not provided in the regions Ra and Rb and the semiconductor substrates W are not provided on one side of the connection plate 48. Therefore, the chemical C is likely to flow over the processing tank 10 to be circulated or flow in a direction perpendicular to the plane of the drawing of FIG. 6 (a direction toward the connection plate 48 out of the directions D2 in FIG. 2) in the regions Ra and Rb.

Accordingly, in the vicinities of the conveyer plate 42 and the connection plate 48, the chemical C in the regions Ra and Rb is likely to circumvent in the directions perpendicular to the plane of the drawing of FIG. 6 (the directions D2) and the flow velocity thereof flowing in a substantially vertically downward direction (a lower direction of the directions D1) along the sidewalls 10a and 10b is decreased.

Meanwhile, the chemical C flowing through between adjacent ones of the semiconductor substrates W flows into the regions Ra and Rb when flowing over the upper ends of the semiconductor substrates W. Since the semiconductor substrates W are adjacent on the both sides in the directions D2, the chemical C in the regions Ra and Rb is unlikely to circumvent in the directions D2 and is likely to flow in the substantially vertically downward direction (the lower direction of the directions D1) along the sidewalls 10a and 10b. Furthermore, when the chemical C flows downward in the regions Ra and Rb, the flow velocity of the chemical C increases because the gaps between the semiconductor substrates W and the sidewalls 10a and 10b decrease in the size.

In this way, the flow velocity of the chemical C differs according to locations in the processing tank 10. This causes an increase in the variation in the phosphoric acid concentration or the silica concentration of the chemical C. The variation in the phosphoric acid concentration or the silica concentration leads to variation in the etching rate or adhesion of deposited materials.

In contrast thereto, the substrate processing device according to the present embodiment includes the current plates 100a to 100d in the regions Ra and Rb as illustrated in FIG. 5. The current plates 100a and 100b are arranged to obstruct the regions Ra and Rb in the vicinity of the conveyer plate 42 as viewed from the directions D2. Accordingly, the current plates 100a and 100b block the chemical C flowing toward the conveyer plate 42 in the direction D2 in FIG. 2 in the regions Ra and Rb, and keep the chemical C on the side of the semiconductor substrates W. As a result, the chemical C flows in the substantially vertically downward direction along the sidewalls 10a and 10b from the regions Ra and Rb in the vicinity of the conveyer plate 42.

The current plates 100c and 100d are arranged to obstruct the regions Ra and Rb in the vicinity of the connection plate 48 as viewed from the directions D2. Accordingly, the current plates 100c and 100d block the chemical C flowing toward the connection plate 48 in the direction D2 in FIG. 2 in the regions Ra and Rb, and keep the chemical C on the side of the semiconductor substrates W. As a result, the chemical C flows in the substantially vertically downward direction along the sidewalls 10a and 10b from the regions Ra and Rb in the vicinity of the connection plate 48.

In this way, the current plates 100a to 100d can cause the flows of the chemical C in the vicinities of the conveyer plate 42 and the connection plate 48 to be similar to the flows of the chemical C in a middle portion of the array of the semiconductor substrates W.

It is preferable that the locations of the upper ends of the current plates 100a to 100d are positioned equal to or higher than the upper end of the processing tank 10 or the upper end of the chemical C. Accordingly, as viewed from the directions D2, the current plates 100a to 100d are provided entirely in the regions Ra and Rb and can cause the flows of the chemical C in the vicinities of the conveyer plate 42 and the connection plate 48 to be similar to the flows of the chemical C in the middle portion. Meanwhile, the lower ends of the current plates 100a to 100d may be provided to a bottom portion of the processing tank 10, or be provided to the lower end of the conveyer plate 42 or the connection plate 48 of the lifter 40. As will be explained in a second embodiment, the locations of the lower ends of the current plates 100a to 100d may be raised to the level of the centers of the semiconductor substrates W. To substantially uniformize the flows of the chemical C in the array of the semiconductor substrates W, it is preferable that the shapes, the sizes, and the locations of the upper ends and lower ends of the current plates 100a to 100d are equalized.

Figure 7:
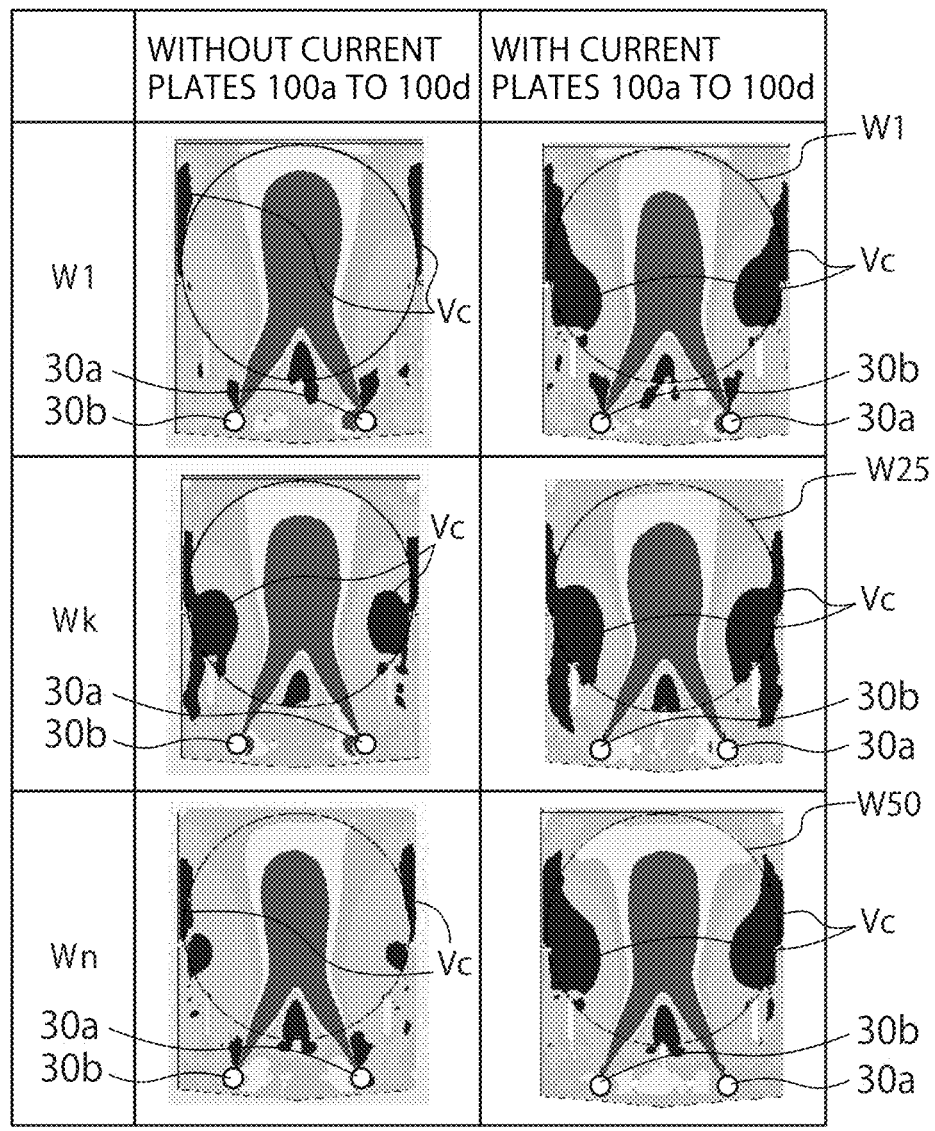
FIG. 7 is a graph illustrating a result of a simulation of the flow velocity of a chemical.

FIG. 7 is a graph illustrating a result of a simulation of the flow velocity of the chemical C. W1 denotes a semiconductor substrate W closest to the conveyer plate 42 in the array of the semiconductor substrates W. Wn denotes a semiconductor substrate W closest to the connection plate 48 in the array of the semiconductor substrates W. Wk (1<k<n) denotes a semiconductor substrate W arranged in the middle of the array of the semiconductor substrates W. The graph of FIG. 7 indicates a flow velocity distribution of the chemical C with respect to each of the semiconductor substrates W1, Wk, and Wn viewed from the directions D2. Vc denotes a region where the chemical C from the regions Ra and Rb toward downward along the sidewalls 10a and 10b of the processing tank 10 flows at a certain flow velocity.

In a case in which the current plates 100a to 100d are not provided, the semiconductor substrates W1 and Wn have significantly small regions where the chemical C is flowing at the flow velocity Vc while the semiconductor substrate Wk has regions where the chemical C is flowing at the flow velocity Vc. That is, it is found that the flow velocity of the chemical C from the regions Ra and Rb toward downward greatly differs between the end portions (the vicinities of the conveyer plate 42 and the connection plate 48) of the array of the semiconductor substrates W and the middle portion thereof if the current plates 100a to 100d are not provided.

On the other hand, in a case in which the current plates 100a to 100d are provided, the regions where the chemical C is flowing at the flow velocity Vc distribute comparably on the semiconductor substrates W1, Wk, and Wn. That is, it is found that the flow velocity of the chemical C from the regions Ra and Rb toward downward along the sidewalls 10a and 10b does not depend so much on the locations in the array of the semiconductor substrates W in the case in which the current plates 100a to 100d are provided.

As described above, according to the present embodiment, the provision of the current plates 100a to 100d in the regions Ra and Rb in the vicinities of the conveyer plate 42 and the connection plate 48 enables the flow velocity of the chemical C in the vicinities of the conveyer plate 42 and the connection plate 48 to be similar to the flow velocity of the chemical C in the middle portion of the array of the semiconductor substrates W. As a result, variation in the phosphoric acid concentration or the silica concentration of the chemical C can be suppressed, and variation in the etching rate or adhesion of deposited materials can be suppressed.

In the present embodiment, it is not always necessary to provide all the current plates 100a to 100d and at least some of the current plates 100a to 100d may be provided. For example, even in a case in which the current plates 100a and 100b are provided and the current plates 100c and 100d are not provided, the substrate processing device can achieve the effects of the present embodiment to some extent. Even in the opposite case in which the current plates 100c and 100d are provided and the current plates 100a and 100b are not provided, the substrate processing device can achieve the effects of the present embodiment to some extent.

Second Embodiment

Figure 8:
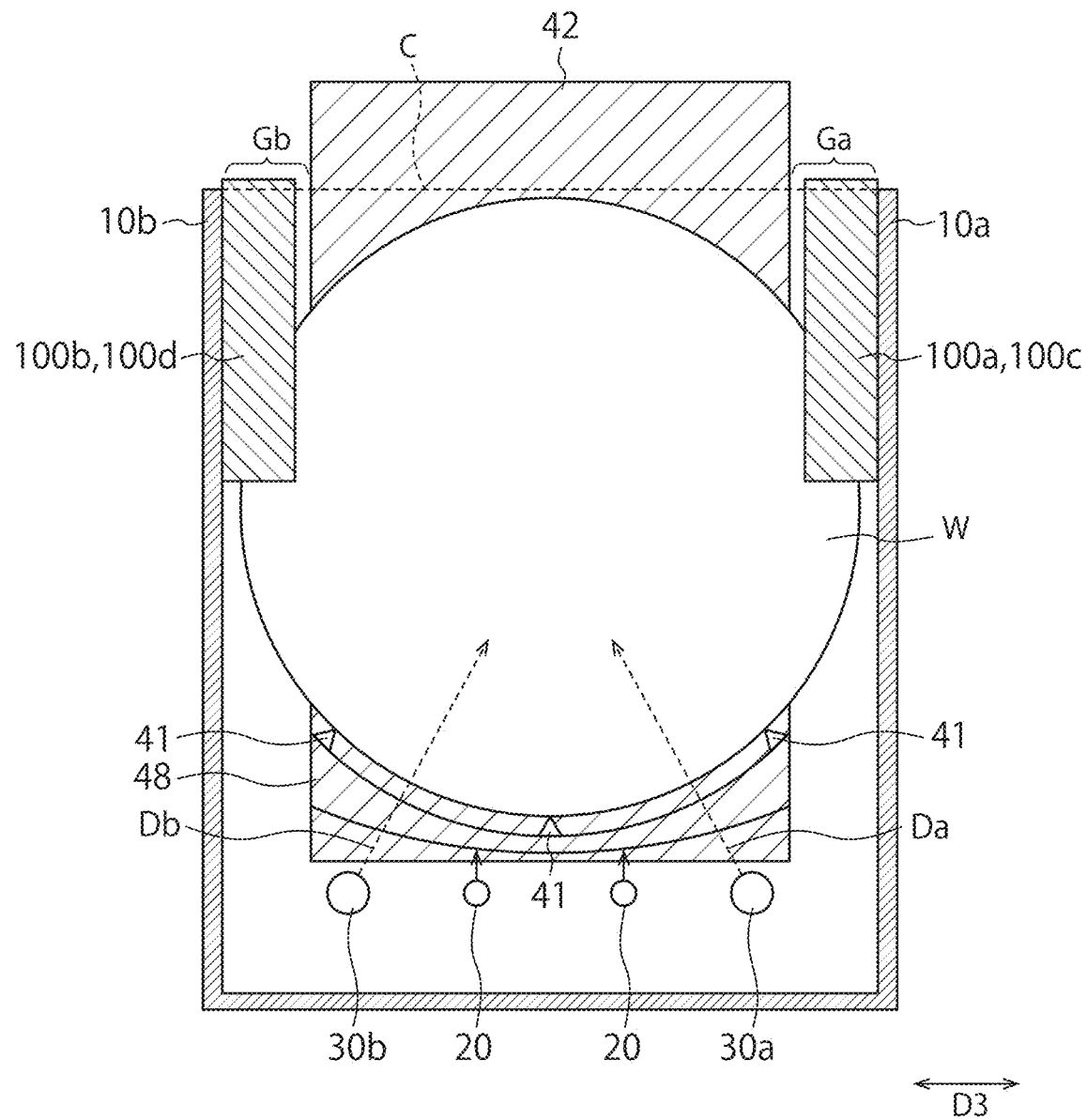
FIG. 8 is a front view of a processing tank and a lifter according to a second embodiment.

FIG. 8 is a front view of a processing tank and a lifter according to the second embodiment. In the second embodiment, the locations of the lower ends of the current plates 100a to 100d are higher than those in the first embodiment. It suffices that the current plates 100a to 100d are provided in the regions Ra and Rb in FIG. 6 as viewed from the directions D2. Therefore, it suffices that the current plates 100a to 100d are located above the centers of the semiconductor substrates W. That is, it suffices that the lower ends of the current plates 100a to 100d are at height locations in the vicinity of the centers of the semiconductor substrates W.

Even in a case in which the lower ends of the current plates 100a to 100d are at higher locations than the centers of the semiconductor substrates W, the effects of the present embodiment are achieved to some extent. However, in order to sufficiently produce the effects of the present embodiment, it is preferable that the current plates 100a to 100d are provided entirely in the regions Ra and Rb in FIG. 6 as viewed from the directions D2.

Third Embodiment

Figure 9:
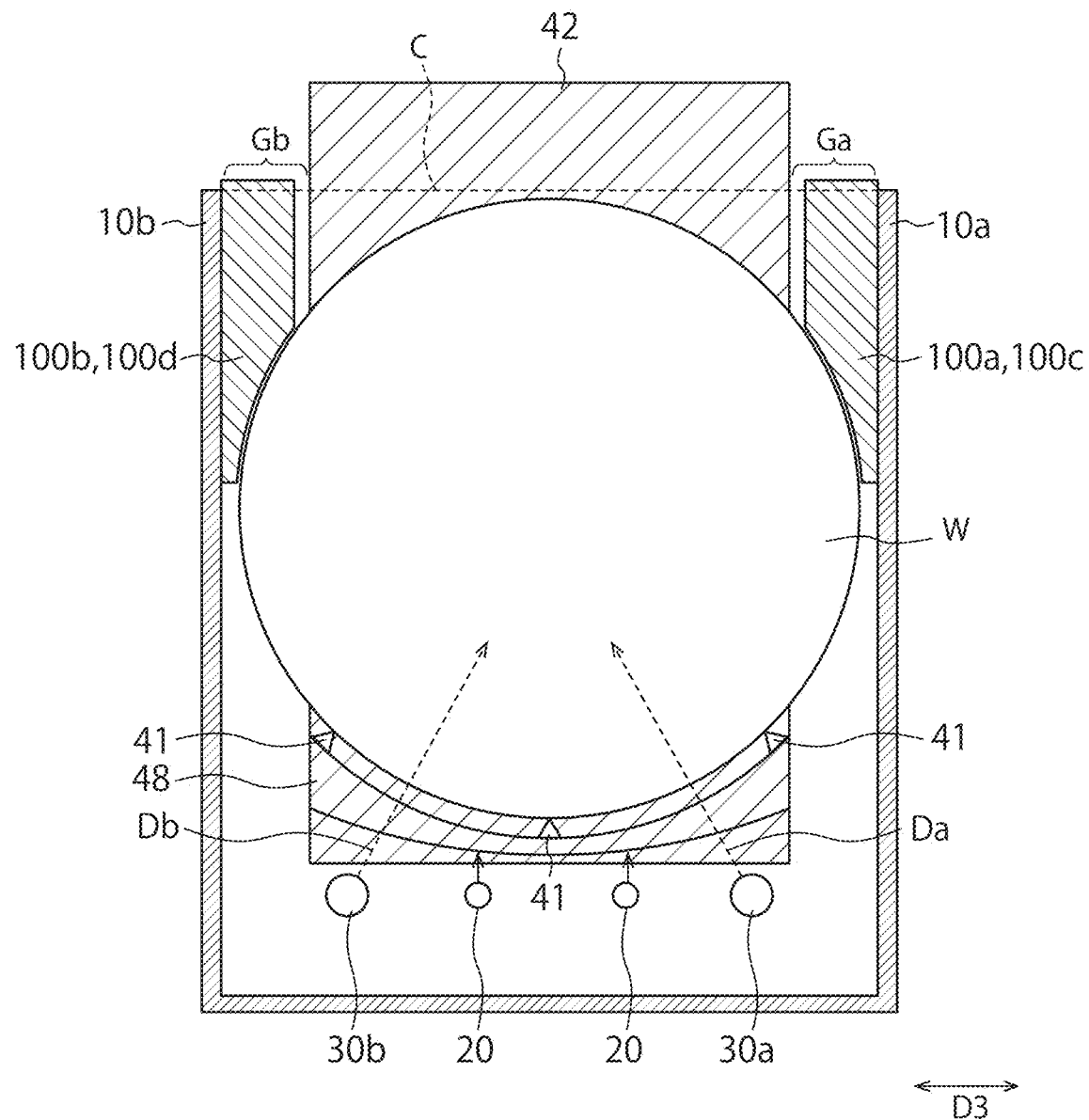
FIG. 9 is a front view of a processing tank and a lifter according to a third embodiment.

FIG. 9 is a front view of a processing tank and a lifter according to a third embodiment. In the third embodiment, the shapes of the current plates 100a to 100d are formed to be substantially identical to those of the regions Ra and Rb in FIG. 6 as viewed from the directions D2. That is, parts of the lower ends of the current plates 100a to 100d are respectively formed in a substantially arc shape along the outer edge of the semiconductor substrates W. Even with this shape, the current plates 100a to 100d can obstruct the regions Ra and Rb in FIG. 6 as viewed from the directions D2. Accordingly, the third embodiment can also achieve the effects identical to that of the first embodiment.

Fourth Embodiment

Figure 10:
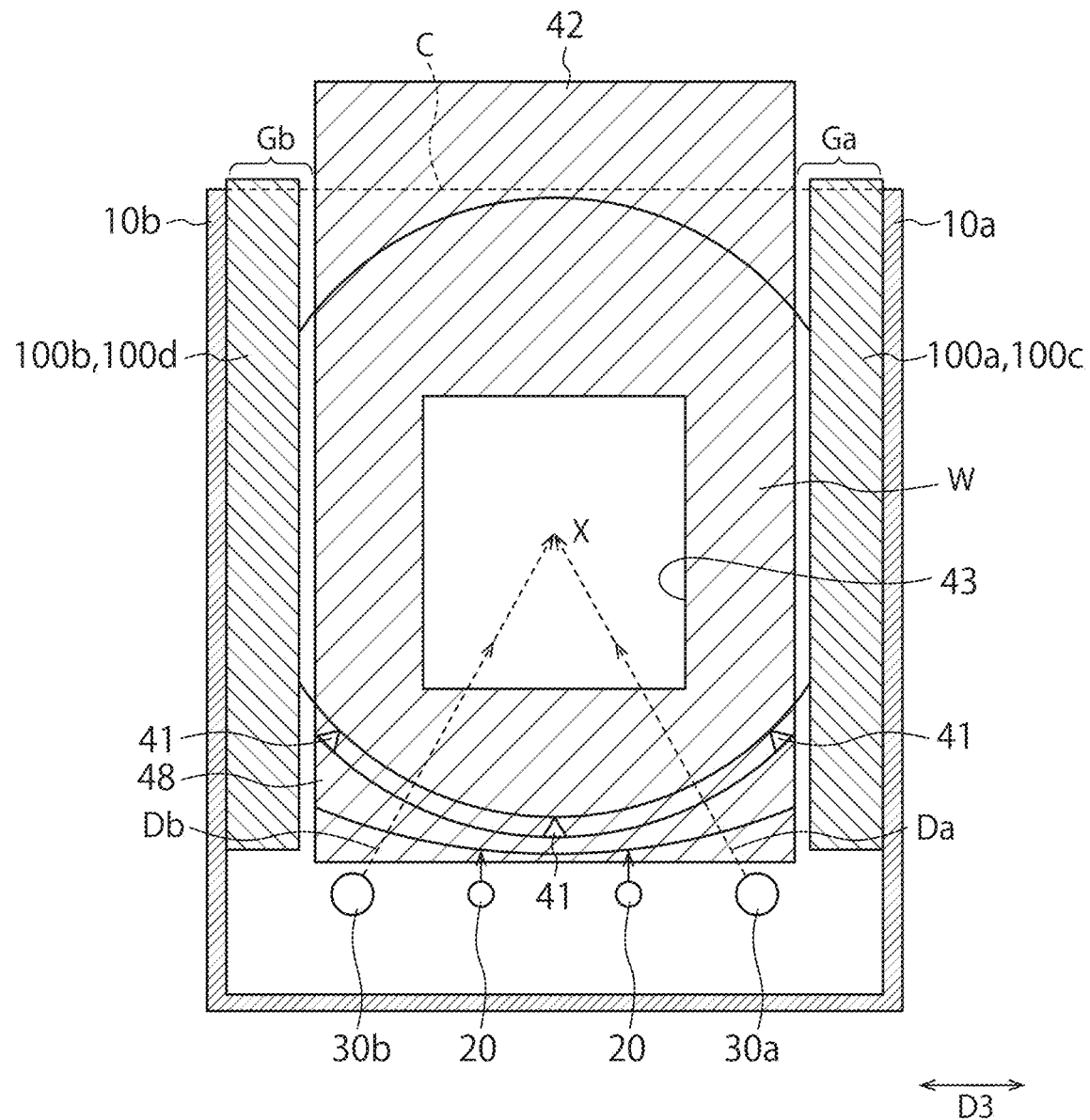
FIG. 10 is a front view of a processing tank and a lifter according to a fourth embodiment.

FIG. 10 is a front view of a processing tank and a lifter according to a fourth embodiment. In the fourth embodiment, an opening 43 is provided at a central portion of the conveyer plate 42 including the intersecting position X as viewed from the directions D2. With the opening 43, a part of the chemical C flowing between the conveyer plate 42 and the semiconductor substrates W passes through the opening 43 to flow outside the conveyer plate 42, and the flow velocity of the chemical C flowing upward between the conveyer plate 42 and the semiconductor substrates W is reduced. Therefore, the flow velocity of the chemical C passing upward between the conveyer plate 42 and the semiconductor substrates W is reduced. As a result, the flow velocity of the chemical C passing upward between the conveyer plate 42 and the semiconductor substrates W is not so different from the flow velocity of the chemical C passing between adjacent ones of the semiconductor substrates W. This can suppress variation in the phosphoric acid concentration or the silica concentration of the chemical C and can suppress variation in the etching rate or adhesion of deposited materials.

Figure 11:
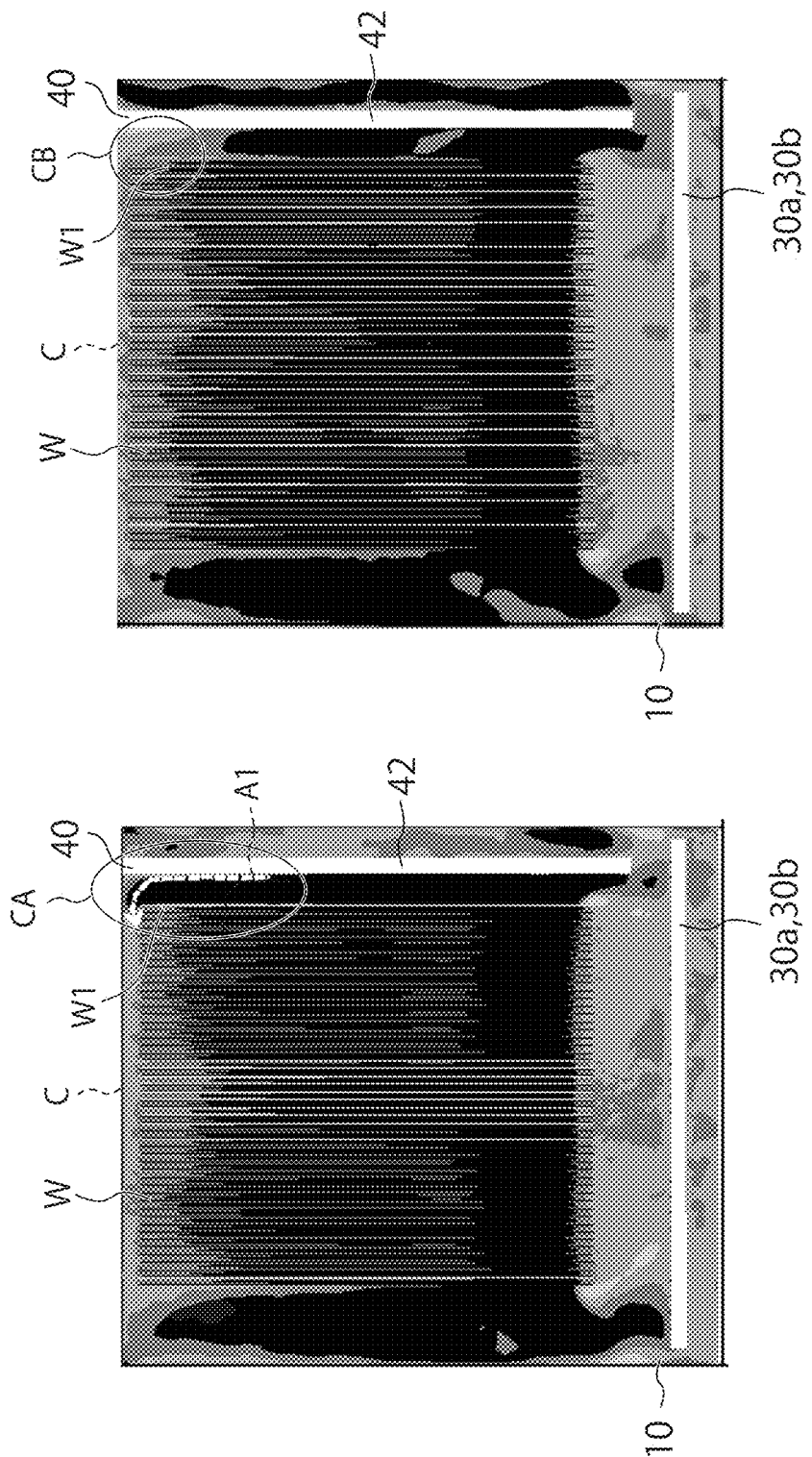
FIG. 11A is a diagram illustrating a distribution of the flow velocity of the chemical in a case in which the lifter not including an opening is used.
FIG. 11B is a diagram illustrating a distribution of the flow velocity of the chemical in a case in which the lifter including the opening is used.

FIG. 11A is a diagram illustrating a distribution of the flow velocity of the chemical C in a case in which the lifter 40 not including the opening 43 is used. In FIGS. 11A and 11B, parts similar to white indicate that the flow velocity of the chemical C is low and parts similar to black indicate that the flow velocity of the chemical C is high. FIGS. 11A and 11B illustrate states of the chemical C in central portions of the semiconductor substrates W in the directions D3.

In the case in which the opening 43 is not provided, the flow velocity of the chemical C is significantly higher in the vicinity of the upper end portion of the semiconductor substrate W1 than in other portions as indicated by a circle CA in FIG. 11A. The reason is as follows. Since there is only a small escape for the chemical C flowing into between the semiconductor substrate W1 and the conveyer plate 42, the chemical C swiftly flows in the opposite direction to the conveyer plate 42 above the upper end portion of the semiconductor substrate W1 when the chemical C reaches the upper end portion of the semiconductor substrate W1. Accordingly, the chemical C flows as indicated by an arrow A1. This causes an increase in the variation in the phosphoric acid concentration or the silica concentration of the chemical C.

FIG. 11B is a diagram illustrating a distribution of the flow velocity of the chemical C in a case in which the lifter 40 including the opening 43 is used.

In the case in which the opening 43 is provided, the flow velocity of the chemical C is not so high in the vicinity of the upper end portion of the semiconductor substrate W1 as indicated by a circle CB in FIG. 11B. This is because a part of the chemical C flowing into between the semiconductor substrate W1 and the conveyer plate 42 flows outside the lifter 40 through the opening 43. Therefore, the flow velocity of the chemical C flowing above the upper end portion of the semiconductor substrate W1 is relatively low and is equivalent to the flow velocities in other portions. This can suppress variation in the phosphoric acid concentration or the silica concentration of the chemical C and can suppress variation in the processing speed (for example, the etching rate) for the semiconductor substrates. In this way, the lifter 40 according to the present embodiment may have the opening 43 on the conveyer plate 42.

The fourth embodiment may be combined with the current plates 100a to 100d according to the second or third embodiment.

Fifth Embodiment

Figure 12:
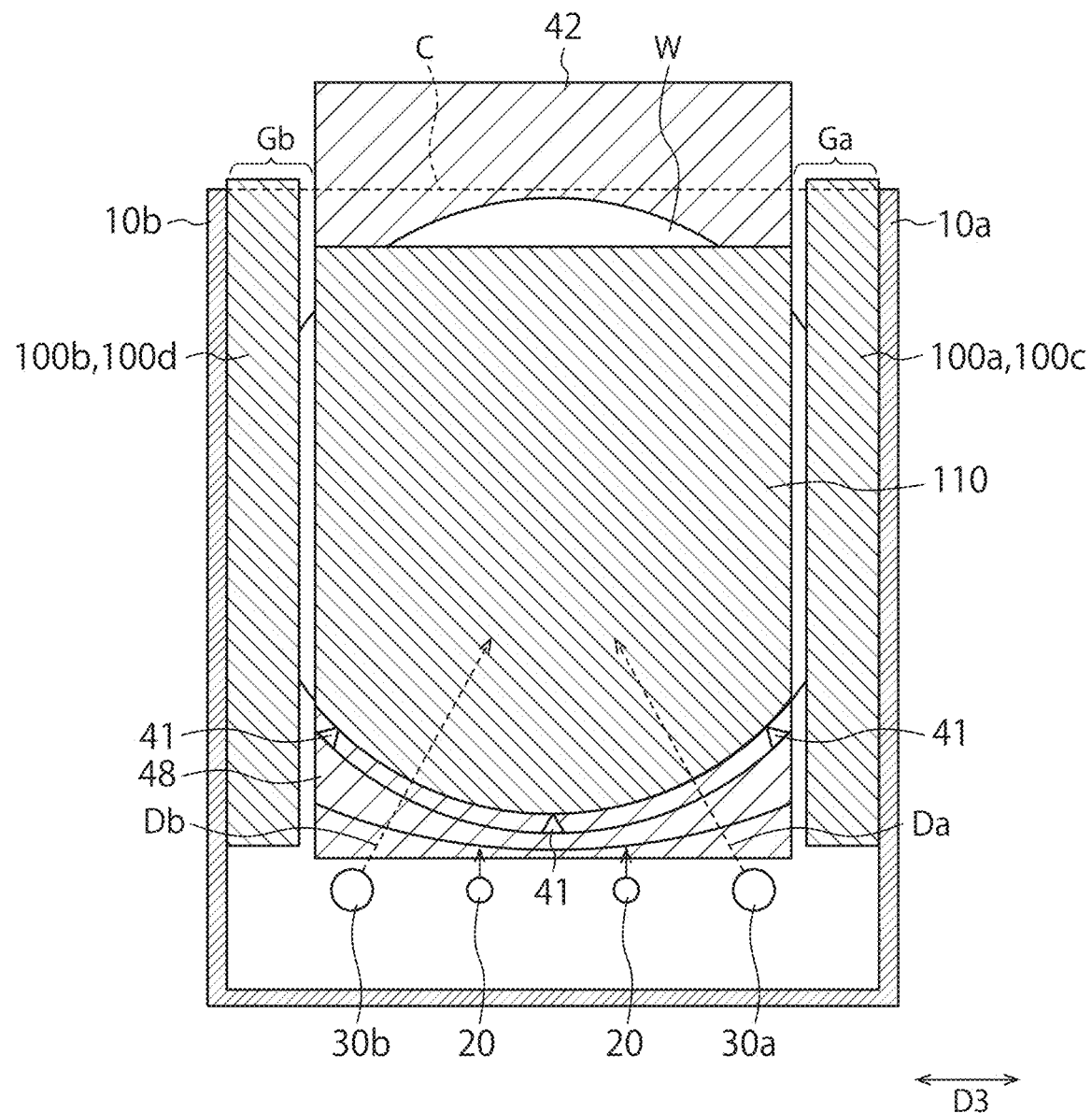
FIG. 12 is a front view of a processing tank and a lifter according to a fifth embodiment.

FIG. 12 is a front view of a processing tank and a lifter according to a fifth embodiment. In the fifth embodiment, a current plate 110 being a fifth current plate is provided between the current plate 100c and the current plate 100d. The current plate 110 is provided on the opposite side of the array of the semiconductor substrates W to the conveyer plate 42. The current plate 110 may be connected to the supports 41 of the lifter 40 or may be fixed to a wall surface of the processing tank 10. The current plate 110 may be mounted on the supports 41 of the lifter 40 in the same manner as the semiconductor substrates W. The lower end of the current plate 110 has a substantially arc shape identical to that of the semiconductor substrates W and has a shape along lower portions of the semiconductor substrates W. The both lateral sides of the current plate 110 extend linearly in a substantially vertical direction. The width of the current plate 110 in the directions D3 is equal to or slightly narrower than the interval between the current plate 100c and the current plate 100d. Accordingly, the current plate 110 can move with the lifter 40 without interfering with the current plates 100c and 100d. Further, the upper side of the current plate 110 extends linearly in a substantially horizontal direction. The level of the upper side of the current plate 110 may be equal to or lower than the level of the upper end of the processing tank 10 or the level of the liquid surface of the chemical C.

The current plate 110 may be arranged at a location nearer the semiconductor substrates W than the current plates 100a to 100d or may be arranged at a substantially same location as that of the current plates 100a to 100d as viewed from the directions D3.

The current plate 110 is arranged at a location facing the conveyer plate 42 in the array of the semiconductor substrates W. Accordingly, the states of the flow of the chemical C are enabled to be similar between the semiconductor substrate W1 in the vicinity of the conveyer plate 42 and the semiconductor substrate Wn in the vicinity of the current plate 110. Since the fifth embodiment has the current plates 100a to 100d, the fifth embodiment can also achieve the effects of the first embodiment. Since the current plate 110 obstructs the gaps Ga and Gb similarly to the current plates 100a to 100d, the flow of the chemical C in the directions D2 passing through the gaps Ga and Gb can be further suppressed.

The shape of the lower end of the current plate 110 is not particularly limited and may be substantially linear or the like. Further, the fifth embodiment may be combined with the current plates 100a to 100d according to the second or third embodiment. The opening 43 according to the fourth embodiment may be provided on the conveyer plate 42 in the fifth embodiment. Accordingly, the fifth embodiment can further achieve the effects of any of the second to fourth embodiments.

Sixth Embodiment

Figure 13:
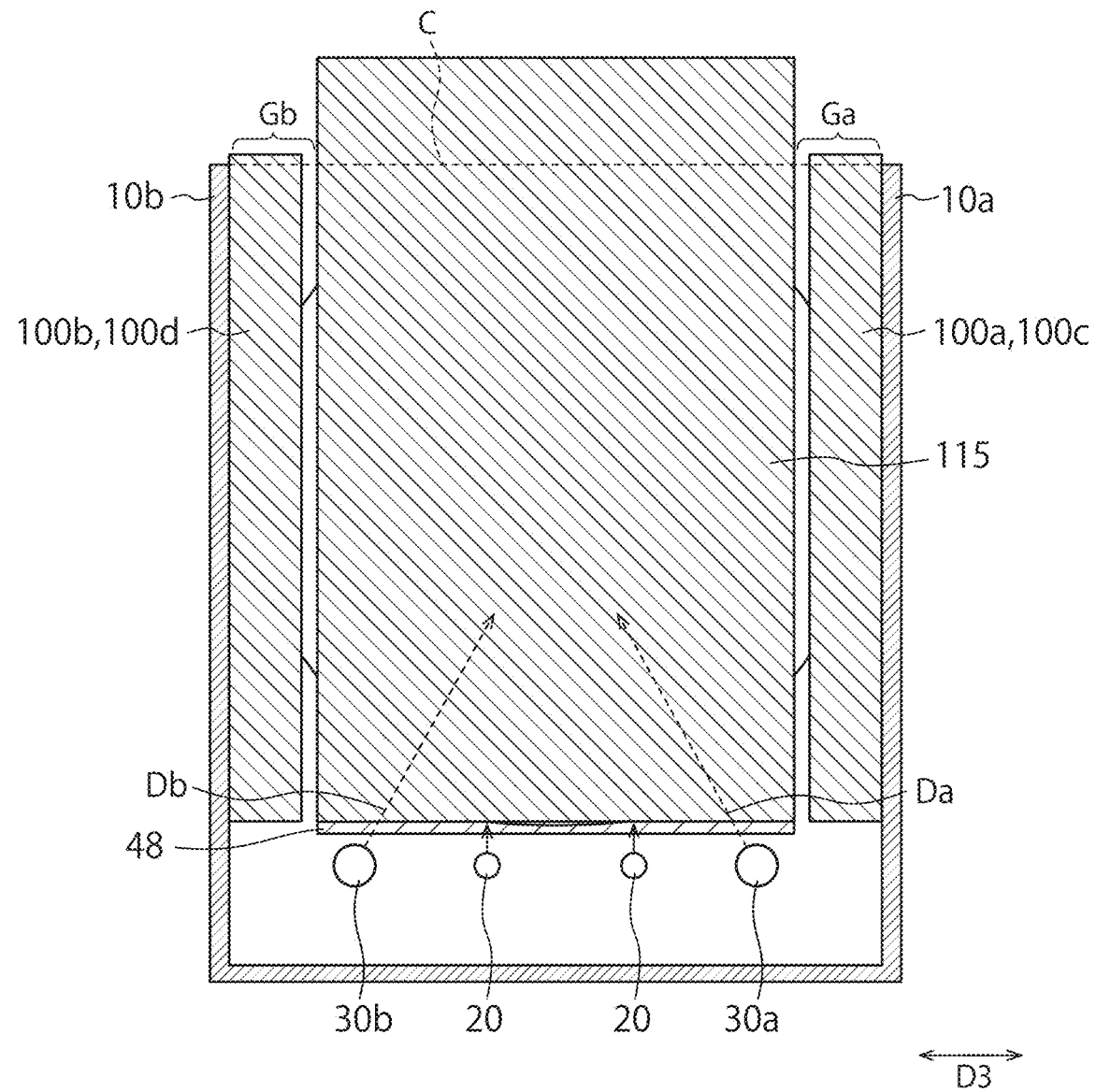
FIG. 13 is a front view of a processing tank and a lifter according to a sixth embodiment.
Figure 14:
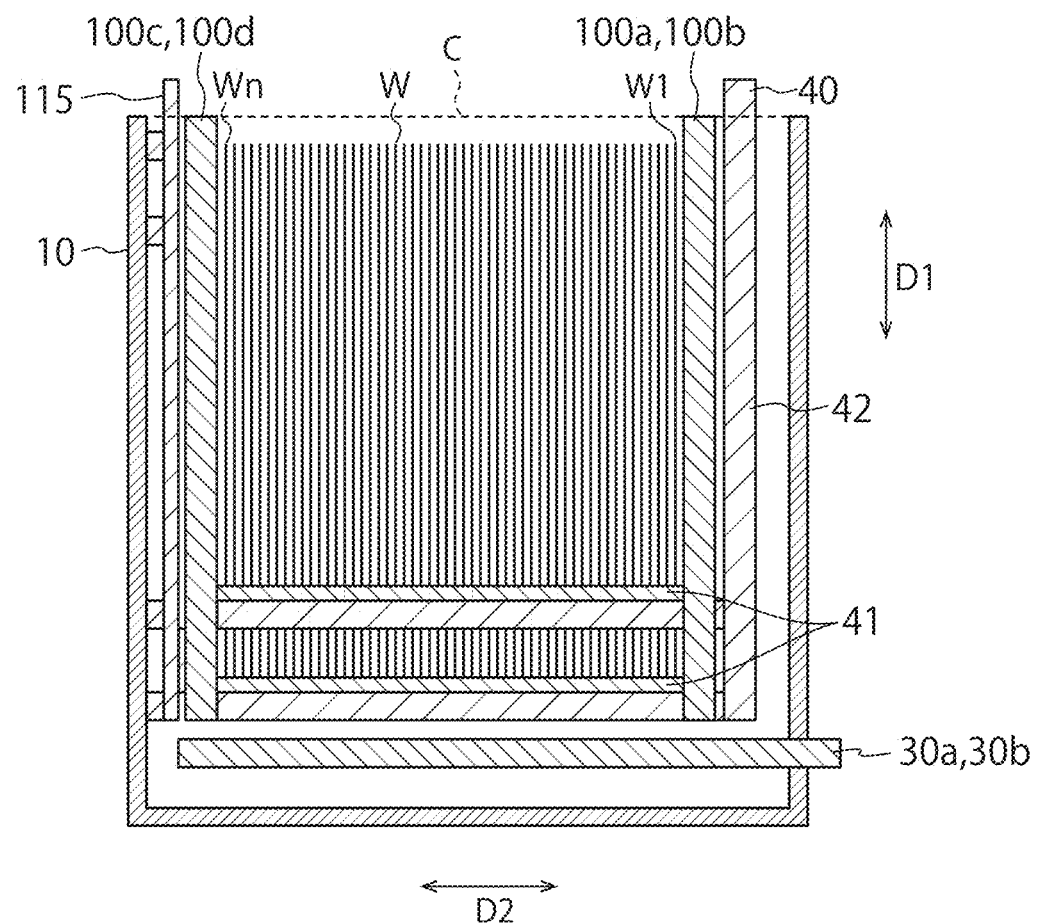
FIG. 14 is a side view of a processing tank and a lifter according to the sixth embodiment.

FIG. 13 is a front view of a processing tank and a lifter according to a sixth embodiment. FIG. 14 is a side view of the processing tank and the lifter according to the sixth embodiment. In the sixth embodiment, a current plate 115 being the fifth current plate is provided between the current plate 100c and the current plate 100d. As illustrated in FIG. 14, the current plate 115 is provided on the opposite side of the array of the semiconductor substrates W to the conveyer plate 42. The current plate 115 is fixed to a wall surface of the processing tank 10. The current plate 115 is positioned between the connection plate 48 and the wall surface of the processing tank 10 as viewed from the directions D3. The lower side of the current plate 115 is positioned below the semiconductor substrates W at the time of processing the semiconductor substrates W. Further, at the time of processing the semiconductor substrates W, the current plate 115 extends to a location higher than the liquid surface of the chemical C in the processing tank 10 and the upper side thereof is positioned above the liquid surface of the chemical C similarly to the upper side of the conveyer plate 42.

The upper side of the current plate 115 is positioned above the liquid surface of the chemical C substantially entirely from the vicinity of the current plate 100c to the vicinity of the current plate 100d in the directions D3. That is, the upper side of the current plate 115 is positioned above the liquid surface of the chemical C substantially entirely between the gaps Ga and Gb.

The width of the current plate 115 in the directions D3 is equal to or slightly narrower than the interval between the current plate 100c and the current plate 100d. The width of the current plate 115 in the directions D3 may be substantially the same as that of the conveyer plate 42. As illustrated in FIG. 13, the current plate 115 is arranged between the current plate 100c and the current plate 100d as viewed from the directions D2 in FIG. 14.

The current plate 115 is arranged at a location facing the conveyer plate 42 in the array of the semiconductor substrates W. As illustrated in FIG. 14, the interval between the current plate 115 and the current plates 100c and 100d or the interval between the current plate 115 and the semiconductor substrate Wn is substantially the same as the interval between the conveyer plate 42 and the current plates 100a and 100b or the interval between the conveyer plate 42 and the semiconductor substrate W1. Accordingly, the states of the flow of the chemical C are enabled to be substantially similar between the semiconductor substrate W1 in the vicinity of the conveyer plate 42 and the semiconductor substrate Wn in the vicinity of the current plate 115.

Since the current plate 115 is located at an upper portion than the liquid surface of the chemical C entirely between the gaps Ga and Gb, the current plates 115, 100c, and 100d suppress the chemical C from overflowing from the processing tank 10 in the left direction in FIG. 14. Meanwhile, the conveyer plates 42 and the current plates 100a, 100b suppress the chemical C from overflowing from the processing tank 10 in the right direction in FIG. 14. Accordingly, the flows of the chemical C in the directions D2 in FIG. 14 can be suppressed in the vicinity of the upper ends of the semiconductor substrates W1 to Wn (near the liquid surface of the chemical C above the semiconductor substrates W). Since the sixth embodiment has the current plates 100a to 100d, the sixth embodiment can also achieve the effects of the first embodiment.

The sixth embodiment may be combined with the current plates 100a to 100d according to the second or third embodiment, or the current plate 110 according to the fifth embodiment. Further, the opening 43 according to the fourth embodiment may be provided on the conveyer plate 42 in the sixth embodiment. Accordingly, the sixth embodiment can further achieve the effects of any of the second to fifth embodiments.

Seventh Embodiment

Figure 15:
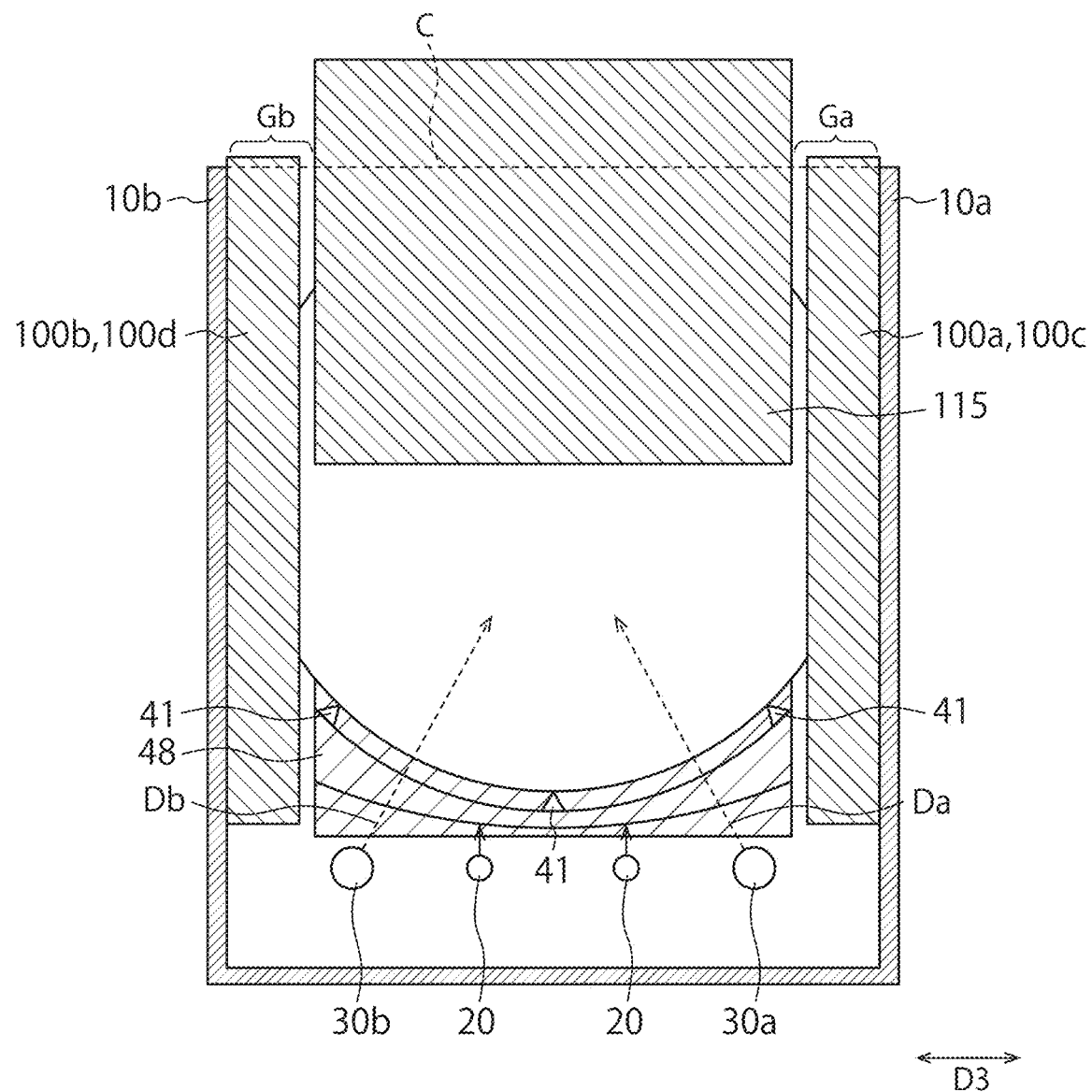
FIG. 15 is a front view of a processing tank and a lifter according to a seventh embodiment.

FIG. 15 is a front view of a processing tank and a lifter according to a seventh embodiment. The seventh embodiment is different from the sixth embodiment in that the lower side of the current plate 115 is at a location higher than that in the sixth embodiment. Although not illustrated, it suffices that the current plate 115 is fixed to a wall surface of the processing tank 10. Other configurations of the seventh embodiment may be identical to the corresponding ones of the sixth embodiment.

Also in the current plate 115 according to the seventh embodiment, the current plate 115 is located at an upper portion than the liquid surface of the chemical C substantially entirely between the gaps Ga and Gb. Therefore, the current plates 115, 100c, and 100d can suppress the chemical C from overflowing from the processing tank 10 toward one side of the array direction of the semiconductor substrates W and can suppress the flow of the chemical C in the array direction of the semiconductor substrates W in the vicinity of the upper ends of the semiconductor substrates W. In addition, the seventh embodiment can also achieve the effects of the sixth embodiment. Since the seventh embodiment has the current plates 100a to 100d, the seventh embodiment can also achieve the effects of the first embodiment.

Also the seventh embodiment may be combined with the current plates 100a to 100d according to the second or third embodiment, or the current plate 110 according to the fifth embodiment. Further, the opening 43 according to the fourth embodiment may be provided on the conveyer plate 42 in the seventh embodiment. With this configuration, the seventh embodiment can further achieve the effects of any of the second to fifth embodiments.

Figure 16:
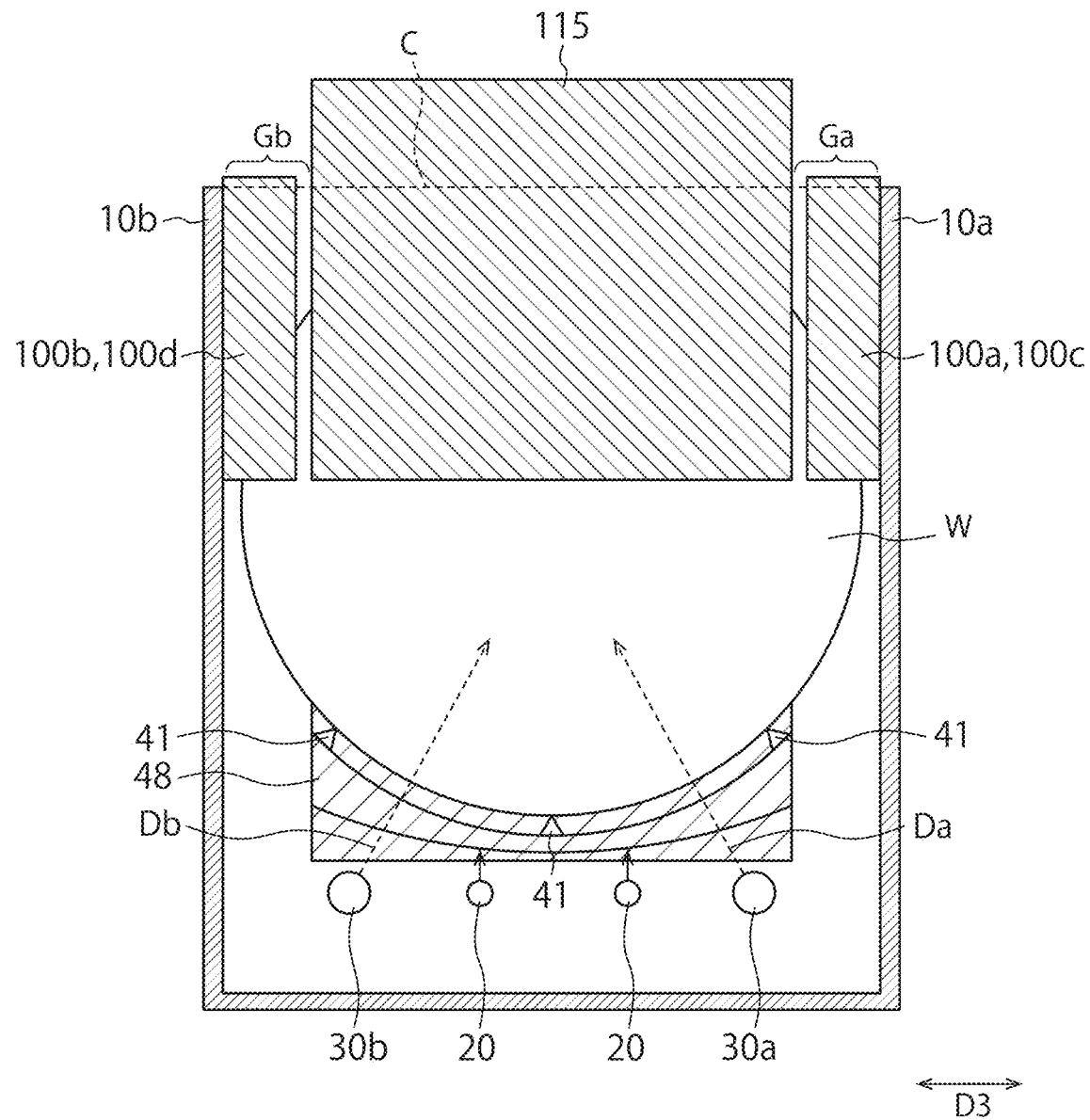
FIG. 16 is a front view of a processing tank and a lifter according to a combination of the second embodiment and the seventh embodiment.

For example, in a case in which the current plate 115 according to the seventh embodiment is applied to the second embodiment, a configuration illustrated in FIG. 16 is obtained. FIG. 16 is a front view of a processing tank and a lifter according to a combination of the second embodiment and the seventh embodiment. The lower side of the current plate 115 may be at a level substantially equal to that of the lower ends of the current plates 100c and 100d. Even with this configuration, the effects of the seventh embodiment are not lost.

Eighth Embodiment

Figure 17:
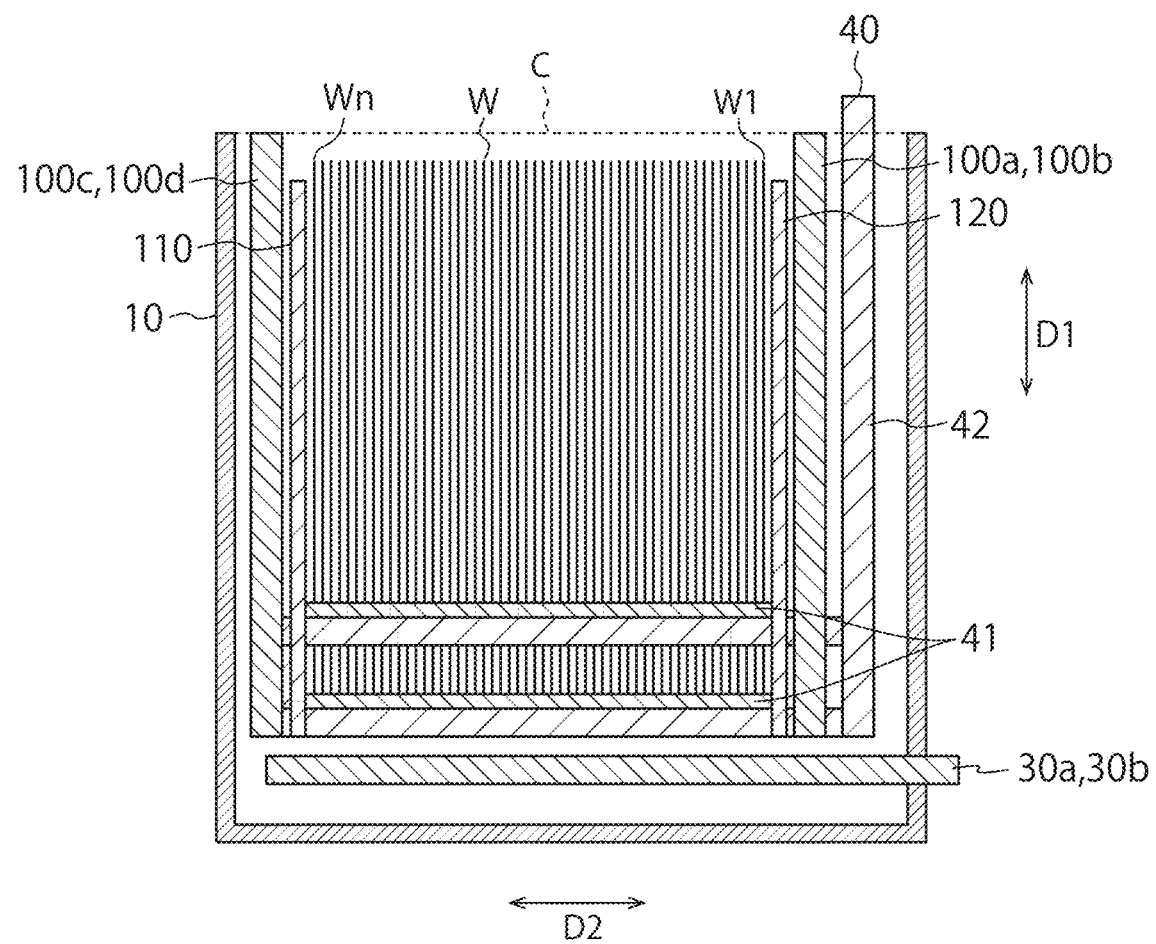
FIG. 17 is a side view of a processing tank and a lifter according to an eighth embodiment.

FIG. 17 is a side view of a processing tank and a lifter according to an eighth embodiment. In the eighth embodiment, a current plate 120 being a sixth current plate is further provided between the current plate 100*a* and the current plate 100*b* as viewed from the directions D2 in FIG. 17. Other configurations of the eighth embodiment may be identical to those of the fifth embodiment. Therefore, the current plate 110 is provided between the current plate 100*c* and the current plate 100*d* as viewed from the directions D2 in FIG. 17.

The current plate 120 is provided on a side toward the conveyer plate 42 of the array of the semiconductor substrates W. The current plate 120 may be connected to the supports 41 of the lifter 40 or may be mounted on the supports 41 of the lifter 40 in the same manner as the semiconductor substrates W. As viewed from the directions D2, the shape of the current plate 120 may, for example, be identical to that of the current plate 110 illustrated in FIG. 12. Therefore, the lower end of the current plate 120 has a substantially arc shape identical to that of the semiconductor substrates W and has a shape along the lower portions of the semiconductor substrates W. The both lateral sides of the current plate 120 extend linearly in a substantially vertical direction. The width of the current plate 120 in the directions D3 is equal to or slightly narrower than the interval between the current plate 100*a* and the current plate 100*b*. Further, the upper side of the current plate 120 extends linearly in a substantially horizontal direction. The level of the upper side of the current plate 120 may be equal to or lower than the level of the upper end of the processing tank 10 or the level of the liquid surface of the chemical C.

The current plate 120 is arranged between the conveyer plate 42 and the semiconductor substrates W in the array of the semiconductor substrates W. The distance between the current plate 120 and the semiconductor substrate W1 being close thereto is substantially equal to the distance between the current plate 110 and the semiconductor substrate Wn being close thereto. Accordingly, the states of the flow of the chemical C are enabled to be substantially similar between the semiconductor W1 in the vicinity of the current plate 120 and the semiconductor Wn in the vicinity of the current plate 110. Further, since the eighth embodiment has the current plates 100*a* to 100*d*, the eighth embodiment can also achieve the effects of the first embodiment. Since the current plate 110 obstructs the gaps Ga and Gb similarly to the current plates 100*a* to 100*d*, the flows of the chemical C in the directions D2 passing through the gaps Ga and Gb can be further suppressed.

The shape of the lower end of the current plate 120 is not particularly limited and may be substantially linear or the like. In this case, it is preferable that the shape of the current plate 120 and the attaching method thereof as viewed from the directions D2 are substantially the same as the shape of the current plate 110 and the attaching method thereof. This is to improve the symmetric property of the flows of the chemical C in the directions D2. Further, the eighth embodiment may be combined with the sixth or seventh embodiment. That is, the current plate 120 may be provided on the side toward the conveyer plate 42 in the array of the semiconductor substrates W in the sixth or seventh embodiment.

Although several embodiments of the present invention have been described above, these embodiments are presented for purposes of illustration only and are not intended to limit the scope of the invention. These embodiments can also be carried out in other various modes, and various types of omissions, replacements, and modifications can be made without departing from the spirit of the invention. These embodiments and modifications thereof are included in the spirit and scope of the invention, and are also included in the invention described in the appended claims and equivalents thereof.

The invention claimed is:

1. A substrate processing device comprising:
a processing tank configured to be capable of accumulating a liquid;
a conveyer configured to be capable of arraying a plurality of semiconductor substrates in such a manner that front surfaces of the semiconductor substrates face a substantially horizontal direction, and transporting the semiconductor substrates into the processing tank;
a plurality of liquid suppliers configured to be capable of supplying the liquid toward an inside of the processing tank from a lower portion of the processing tank; and
a plurality of current plates being arranged on at least either one end side or the other end side of an array of the semiconductor substrates, the current plates being provided in a first gap region above the semiconductor substrates in gaps between the conveyer and a sidewall of the processing tank on both sides of the conveyer as viewed from an array direction of the semiconductor substrates, wherein
the conveyer transports the semiconductor substrates into or out of the processing tank by moving the semiconductor substrates up or down, and
the current plates are provided at locations where the current plates are not in contact with the conveyer and the semiconductor substrates.

2. The substrate processing device according to claim 1, wherein upper ends of the current plates are positioned at locations equal to or higher than an upper end of the processing tank.

3. The substrate processing device according to claim 1, wherein the current plates are provided to obstruct the first gap region as viewed from the array direction of the semiconductor substrates.

4. The substrate processing device according to claim 1, wherein
the current plates are arranged on one end side of the array of the semiconductor substrates, and
a distance between a semiconductor substrate adjacent to the current plates on the one end side of the array of the semiconductor substrates and the current plates along the array direction of the semiconductor substrates has a value from an interval between the semiconductor substrates to twice as large as the interval.

5. The substrate processing device according to claim 1, wherein
the current plates comprise:
a first current plate and a second current plate arranged on one end side of the array of the semiconductor substrates and respectively arranged on both sides of the conveyer as viewed from the array direction of the semiconductor substrates; and
a third current plate and a fourth current plate arranged on the other end side of the array of the semiconductor substrates and respectively arranged on both sides of the conveyer as viewed from the array direction of the semiconductor substrate.

6. The substrate processing device according to claim 5, wherein a distance between a semiconductor substrate adjacent to the first and second current plates on the one end side of the array of the semiconductor substrate and the first and second current plates along the array direction of the semiconductor substrates has a value from an interval between the semiconductor substrates to twice as large as the interval.

7. The substrate processing device according to claim 6, wherein a distance between a semiconductor substrate adjacent to the third and fourth current plates on the other end side of the array of the semiconductor substrates and the third and fourth current plates along the array direction of the semiconductor substrates has a value from the interval of the semiconductor substrates to twice as large as the interval.

8. The substrate processing device according to claim 1, wherein the current plates have a substantially same shape and are provided at a substantially same height.

9. The substrate processing device according to claim 1, wherein
the first gap region is located above substantial centers of the semiconductor substrates, and
lower ends of the current plates are at height locations near centers of the semiconductor substrates.

10. The substrate processing device according to claim 1, wherein portions of lower ends of the current plates have a substantially arc shape corresponding to an outer edge of the semiconductor substrates.

11. The substrate processing device according to claim 1, wherein
the conveyer comprises a support supporting the semiconductor substrates from below, and a conveyer plate connecting with the support and facing the semiconductor substrates, and
the conveyer plate has an opening to include an intersecting position of supply directions of the liquid supplied from the liquid suppliers as viewed from the array direction of the semiconductor substrates.

12. The substrate processing device according to claim 1, wherein
the conveyer comprises a support supporting the semiconductor substrates from below, and a conveyer plate connecting with the support and facing the semiconductor substrates, and
the substrate processing device further comprises a fifth current plate provided on an opposite side of the array of the semiconductor substrates to the conveyer plate.

13. The substrate processing device according to claim 12, wherein the fifth current plate is arranged between the current plates as viewed from the array direction of the semiconductor substrates.

14. The substrate processing device according to claim 12, wherein an upper side of the fifth current plate is positioned above a liquid level in the processing tank during processing of the semiconductor substrates.

15. The substrate processing device according to claim 12, further comprising a sixth current plate provided on a side of the conveyer plate with respect to the array of the semiconductor substrates.

16. The substrate processing device according to claim 15, wherein the sixth current plate is arranged between the current plates as viewed from the array direction of the semiconductor substrates.

17. The substrate processing device according to claim 1, wherein the conveyer opens side portions of the semiconductor substrates in directions orthogonal to the array direction of the semiconductor substrates in a substantially horizontal plane.

18. The substrate processing device according to claim 1, wherein the semiconductor substrates are arrayed in such a manner that element formation surfaces of semiconductor substrates in each pair of adjacent semiconductor substrates face each other.

19. The substrate processing device according to claim 1, further comprising a plurality of gas suppliers configured to supply gas bubbles from below the semiconductor substrates.

20. The substrate processing device according to claim 1, wherein planes of the current plates, which obstruct the first gap region between the conveyer and the sidewall of the processing tank, face in a direction perpendicular to a direction in which a plane of the sidewall faces.

* * * * *